(12) United States Patent
Kim et al.

(10) Patent No.: US 11,967,502 B2
(45) Date of Patent: Apr. 23, 2024

(54) METHODS OF FORMING MATERIAL LAYER, SEMICONDUCTOR DEVICES, AND METHODS OF MANUFACTURING THE SAME

(71) Applicant: Samsung Electronics Co., Ltd., Suwon-si (KR)

(72) Inventors: Younsoo Kim, Yongin-si (KR); Jaewoon Kim, Seoul (KR); Haeryong Kim, Seongnam-si (KR); Jinho Lee, Hwaseong-si (KR); Tsubasa Shiratori, Tokyo (JP)

(73) Assignees: Samsung Electronics Co., Ltd. (KR); ADEKA CORPORATION (JP)

( * ) Notice: Subject to any disclaimer, the term of this patent is extended or adjusted under 35 U.S.C. 154(b) by 230 days.

(21) Appl. No.: 17/358,089

(22) Filed: Jun. 25, 2021

(65) Prior Publication Data

US 2021/0407795 A1    Dec. 30, 2021

(30) Foreign Application Priority Data

Jun. 30, 2020   (KR) .................. 10-2020-0080504
Jun. 8, 2021    (KR) .................. 10-2021-0074189

(51) Int. Cl.
*H01L 21/02*     (2006.01)
*H01L 49/02*     (2006.01)

(52) U.S. Cl.
CPC ........ *H01L 21/02274* (2013.01); *H01L 28/40* (2013.01)

(58) Field of Classification Search
None
See application file for complete search history.

(56) References Cited

U.S. PATENT DOCUMENTS

| 8,288,241 | B2 | 10/2012 | Hirota et al. |
| 11,584,986 | B1* | 2/2023 | Abelson ................. C23C 16/04 |
| 2003/0082296 | A1 | 5/2003 | Elers et al. |
| 2003/0201034 | A1* | 10/2003 | Marsh ..................... C23C 16/18 148/276 |
| 2011/0250126 | A1 | 10/2011 | Ivanov et al. |
| 2017/0114459 | A1* | 4/2017 | Saly ................. C23C 16/45527 |
| 2019/0003052 | A1 | 1/2019 | Shero et al. |
| 2020/0312653 | A1* | 10/2020 | Fredrickson ...... C23C 16/45534 |
| 2021/0090892 | A1* | 3/2021 | Yeon ..................... C23C 16/303 |

FOREIGN PATENT DOCUMENTS

KR       10-1069630 B1     10/2011
KR    10-2018-0004650 A      1/2018

* cited by examiner

*Primary Examiner* — Asok K Sarkar
(74) *Attorney, Agent, or Firm* — Myers Bigel, P.A.

(57) ABSTRACT

Methods of forming a material layer according to some embodiments of the inventive concept may include a deposition cycle including providing an adsorption inhibitor on a substrate, purging an excess amount of the adsorption inhibitor, providing a metal precursor on the substrate, purging an excess amount of the metal precursor, and supplying a reactant to form a material layer on the substrate. The adsorption inhibitor may include a group 15 element or a group 16 element.

20 Claims, 27 Drawing Sheets

FIG. 10A

|              | Whether or not adsorption inhibitor is used ||
|              | X    | O    |
|--------------|------|------|
| 111 direction| 70.5 | 78.5 |
| 200 direction| 56   | 83   |

FIG. 10B

|                                  | Whether or not adsorption inhibitor is used ||
|                                  | X     | O     |
|----------------------------------|-------|-------|
| specific resistance of lower electrode | 135.1 | 111.7 |
| specific resistance of upper electrode | 233.3 | 194.6 |

($\mu\Omega \cdot cm$)

METHODS OF FORMING MATERIAL LAYER, SEMICONDUCTOR DEVICES, AND METHODS OF MANUFACTURING THE SAME

CROSS-REFERENCE TO RELATED APPLICATIONS

This application claims the benefit of Korean Patent Applications Nos. 10-2020-0080504 and 10-2021-0074189, respectively filed on Jun. 30, 2020 and Jun. 8, 2021, in the Korean Intellectual Property Office, the disclosures of which are incorporated herein in their entireties by reference.

BACKGROUND

The inventive concept relates to a method of forming a material layer, a method of manufacturing a semiconductor device, and a semiconductor device, and more particularly, to a method of forming a material layer having an excellent step coverage even on a surface of a complex structure with a high aspect ratio, a semiconductor device with a high reliability and an excellent electrical property, and a method of manufacturing the semiconductor device.

An aspect ratio of a structure in a semiconductor device is continuously increasing due to the need of high performance and high integration density of the semiconductor device. A high aspect ratio may cause a material layer to be hard to be formed, and methods of forming the material layer without a void with better electrical properties have been developed.

SUMMARY

The inventive concept provides methods of forming a material layer with an excellent step coverage even on a surface of a complex structure with a high aspect ratio.

The inventive concept provides methods of manufacturing a semiconductor device with a high reliability and excellent electrical properties.

The inventive concept provides semiconductor devices with a high reliability and excellent electrical properties.

According to some embodiments of the inventive concept, methods of forming a material layer may include a deposition cycle including providing an adsorption inhibitor on a substrate; purging an excess amount of the adsorption inhibitor; providing a metal precursor on the substrate; purging an excess amount of the metal precursor; and supplying a reactant to form a material layer on the substrate, wherein the adsorption inhibitor may include a group 15 element or a group 16 element.

According to some embodiments of the inventive concept, methods of forming a material layer may include a deposition cycle including providing an adsorption inhibitor on a substrate in a reaction chamber; purging an excess amount of the adsorption inhibitor to purge from the reaction chamber; providing a metal precursor on the substrate; purging an excess amount of the metal precursor to remove the excess amount of metal precursor from the reaction chamber; and supplying a reactant to form the material layer on the substrate, wherein the adsorption inhibitor may include nitrogen (N), oxygen (O), phosphorus (P), or sulfur (S), and the adsorption inhibitor and the metal precursor may be supplied into the reaction chamber through a vaporizer.

According to some embodiments of the inventive concept, methods of manufacturing a semiconductor device may include forming a lower electrode electrically connected to an active region of a semiconductor substrate; forming a dielectric layer on an entire exposed surface of the lower electrode; and forming an upper electrode on the dielectric layer, wherein at least one of forming the lower electrode and forming the upper electrode includes repeatedly performing a deposition cycle including: providing an adsorption inhibitor containing a group 15 element or a group 16 element on the semiconductor substrate; purging an excess amount of the adsorption inhibitor; providing a metal precursor on the semiconductor substrate; purging an excess amount of the metal precursor; and supplying a reactant to form a material layer on the semiconductor substrate.

According to some embodiments of the inventive concept, a semiconductor device includes two or more lower electrodes on a substrate; a dielectric layer on surfaces of the two or more lower electrodes; and an upper electrode on the dielectric layer and electrically insulated from the two or more lower electrodes, wherein an aspect ratio of each of the two or more lower electrodes is about 30 to about 200, and content of nitrogen (N), oxygen (O), phosphorus (P), or sulfur (S) contained in each of the two or more lower electrodes or the upper electrode is about 0.01 at % to about 10 at %.

BRIEF DESCRIPTION OF THE DRAWINGS

Embodiments of the inventive concept will be more clearly understood from the following detailed description taken in conjunction with the accompanying drawings in which:

FIG. 10A is a table showing measured average grain size results from Experiment 1; and FIG. 10B is a table showing the measured specific resistance for lower and upper electrodes from Experiment 2.

DETAILED DESCRIPTION OF THE EMBODIMENTS

Figure 1:
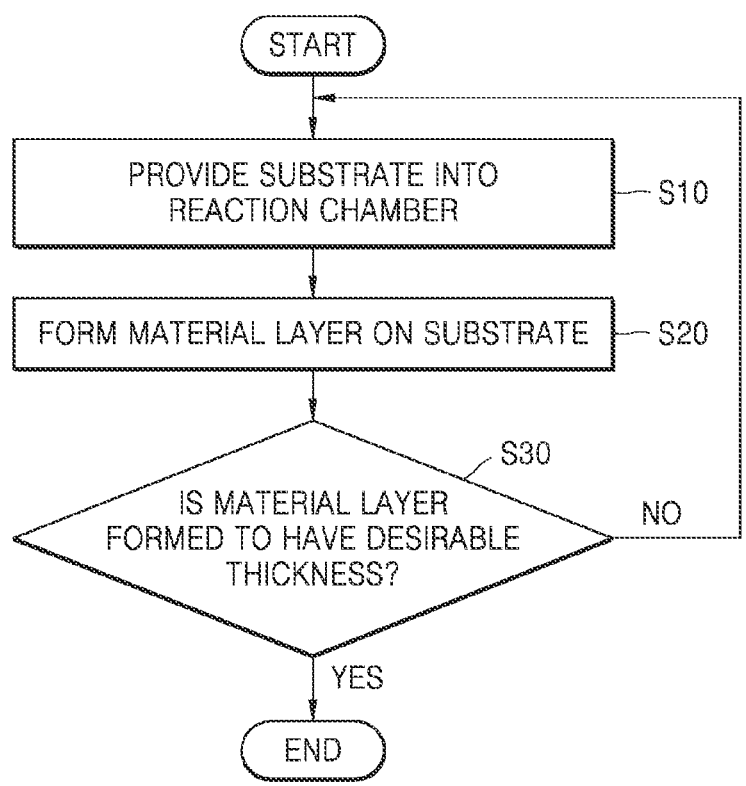
FIG. 1 is a flowchart illustrating a method of forming a material layer according to some embodiments of the inventive concept.

Hereinafter, example embodiments of the inventive concept will be described in detail with reference to the accompanying drawings. The same reference numerals are given to the same or similar components in the drawings, and duplicate descriptions thereof may be omitted.

FIG. 1 is a flowchart illustrating a method of forming a material layer according to some embodiments of the inventive concept.

Referring to FIG. 1, a substrate is provided in a reaction chamber (S10). The substrate may include a semiconductor substrate formed of a semiconductor element such as silicon (Si) or germanium (Ge), or a compound semiconductor such as silicon carbide (SiC), gallium arsenide (GaAs), indium arsenide (InAs), and indium phosphide (InP). In some embodiments, the substrate may include a semiconductor substrate, at least one insulating layer formed on the semiconductor substrate, and/or structures including at least one conductive region. The conductive region may include, for example, a well doped with an impurity, a structure doped with an impurity, a metal-containing conductive layer, and so on. In addition, the substrate may have various isolation structures such as a shallow trench isolation (STI) structure.

A material layer may be formed on the substrate provided in the reaction chamber (S20). The material layer may include a metal nitride or a metalloid nitride.

In some embodiments, the material layer may contain a metal and/or a metalloid such as MxNy (where x and y indicate relative composition ratios of M and nitrogen, respectively, and are real numbers greater than 0 and are not limited in particular). Here, M may be at least one selected from a group consisting of beryllium (Be), boron (B), sodium (Na), magnesium (Mg), aluminum (Al), silicon (Si), potassium (K), calcium (Ca), scandium (Sc), titanium (Ti), vanadium (V), chromium (Cr), manganese (Mn), iron (Fe), cobalt (Co), nickel (Ni), copper (Cu), zinc (Zn), gallium (Ga), germanium (Ge), rubidium (Rb), strontium (Sr), yttrium (Y), zirconium (Zr), niobium (Nb), molybdenum (Mo), technetium (Tc), ruthenium (Ru), rhodium (Rh), palladium (Pd), silver (Ag), cadmium (Cd), indium (In), tin (Sn), antimony (Sb), tellurium (Te), cesium (Cs), barium (Ba), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho)), erbium (Er), thulium (Tm), ytterbium (Yb), lutetium (Lu), hafnium (Hf), tantalum (Ta), tungsten (W), rhenium (Re), osmium (Os), iridium (Ir), platinum (Pt), gold (Au), mercury (Hg), thallium (Tl), lead (Pb), bismuth (Bi), polonium (Po), francium (Fr), radium (Ra), actinium (Ac), thorium (Th), protactinium (Pa), and uranium (U).

In some embodiments, the material layer may be an electrical conductor and may be used for various purposes. For example, a material layer according to some embodiments of the inventive concept may be used in an upper electrode and/or a lower electrode constituting part of a capacitor of a semiconductor memory device, a conductive barrier layer used for wiring, a magnetic film, a barrier metal layer for liquid crystal, a member for a solar cell of a thin film, a member for a semiconductor facility, a nanostructure, a hydrogen storage alloy, and an micro electro mechanical system (MEMS) actuator, and so on but is not limited thereto.

Subsequently, it is determined whether or not the material layer is formed to have a desirable thickness (S30). When the material layer is formed to be thinner than the desirable thickness, a step (S20) of forming the material layer is repeated again, and when the material layer is formed to be thicker than or equal to the desirable thickness, formation of an additional material layer may be stopped.

Figure 2:
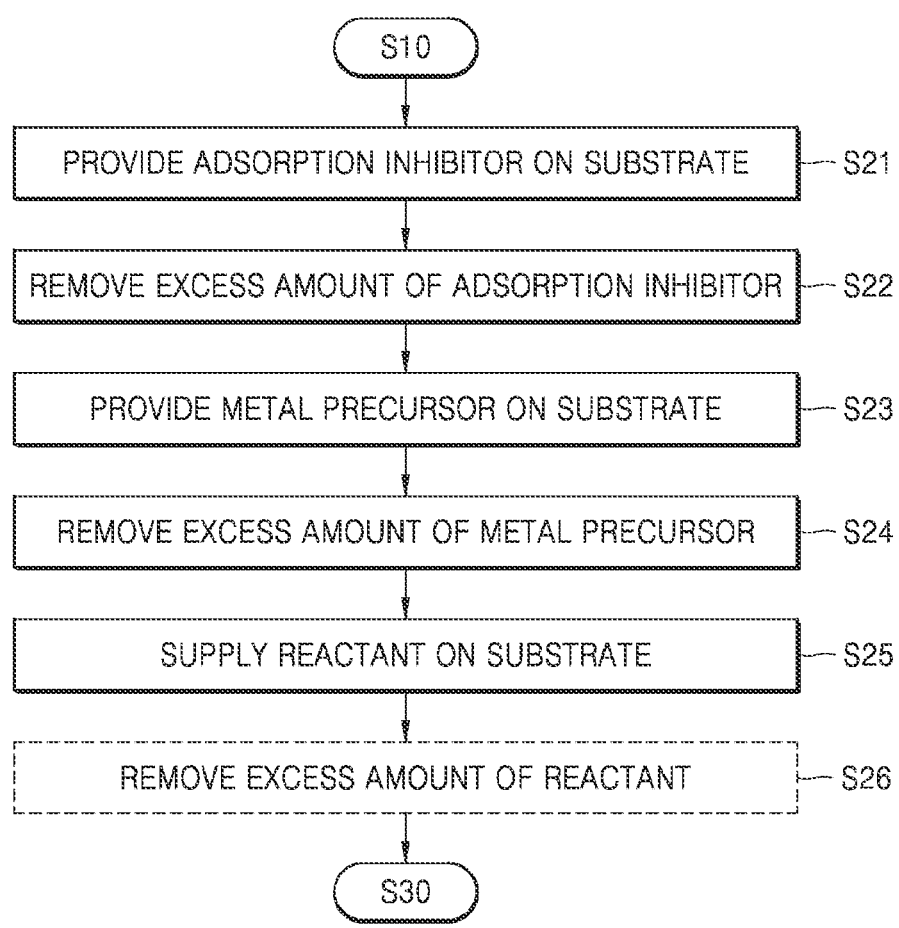
FIG. 2 is a flowchart illustrating methods of forming a material layer on a substrate according to some embodiments of the inventive concept.
Figure 3A:
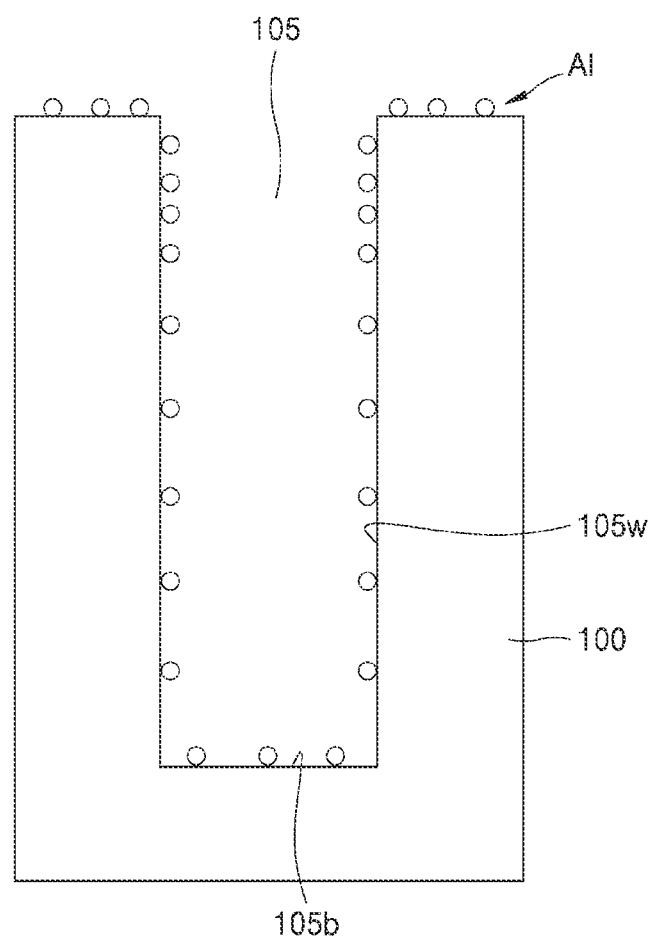
FIGS. 3A to 3C are schematic views conceptually illustrating a mechanism in which a material layer is uniformly formed on a substrate.
Figure 3B:
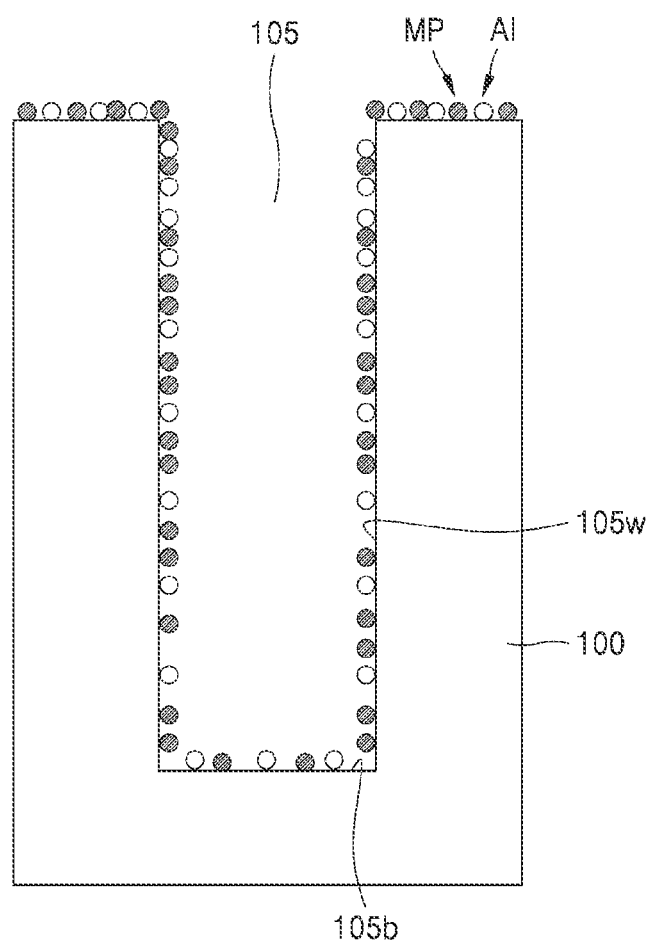
Figure 3C:
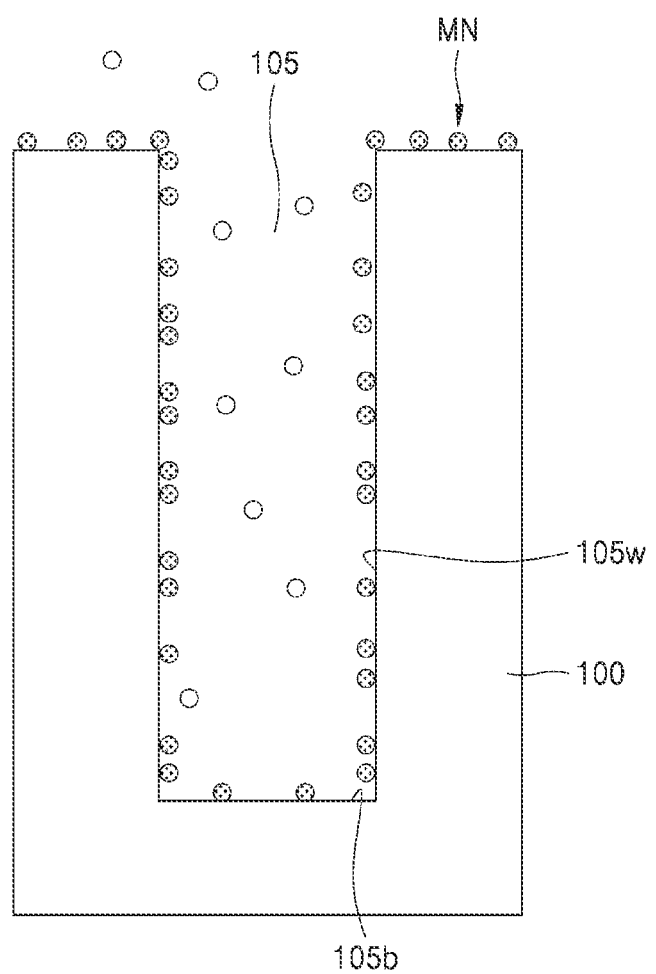

FIG. 2 is a flowchart illustrating step S20 in FIG. 1 according to some embodiments of the inventive concept. FIGS. 3A to 3C are schematic views conceptually illustrating a mechanism in which a material layer is uniformly formed on a substrate 100.

Referring to FIGS. 2 and 3A, an adsorption inhibitor AI may be provided on the substrate 100 (S21). The adsorption inhibitor AI may be adsorbed on a surface of the substrate 100. In some embodiments, the adsorption inhibitor AI may form a coordination bond with the surface of the substrate 100. The adsorption inhibitor AI may form a monolayer on the surface of the substrate 100.

In some embodiments, the adsorption inhibitor AI may be a compound having a structure of $R-A_n-R'$, wherein A is oxygen (O), sulfur (S), selenium (Se), tellurium (Te), or polonium (Po), n is an integer from 1, 2, or 3, R and R' are each independently hydrogen, an alkyl group having 1 to 10 carbons, an alkenyl group having 2 to 10 carbons, an alkynyl group having 2 to 10 carbons, an aryl group having 6 to 15 carbons, a cycloalkyl group having 3 to 12 carbons, or a cycloalkenyl group having 3 to 12 carbons, R and R' are not hydrogen at the same time, and R and R' may be linked to each other to form a ring.

The adsorption inhibitor AI may include, for example, $CH_3OH$, $C_2H_5OH$, $C_3H_7OH$, $C_4H_9OH$, $CH_3-O-CH_3$, $C_2H_5-O-CH_3$, $C_3H_7-O-CH_3$, $C_4H_9-O-CH_3$, $C_2H_5-O-C_2H_5$, $C_3H_7-O-C_2H_5$, $C_4H_9-O-C_2H_5$, $C_3H_7-O-C_3H_7$, $C_4H_9-O-C_3H_7$, $C_4H_9-O-C_4H_9$, $CH_2=CH-OH$, $CH_2=CH-OH$, $CH_2=CH-OH$, $CH_2=CH-OH$, $CH_2=CH-O-CH_3$, $CH_2=CH-O-CH_3$, $CH_2=CH-O-CH_3$, $CH_2=CH-O-CH_3$, $CH_2=CH-O-C_2H_5$, $CH_2=CH-O-C_2H_5$, $CH_2=CH-O-C_2H_5$, $CH_2=CH-O-C_3H_7$, $CH_2=CH-O-C_3H_7$, $CH_2=CH-O-C_4H_9$, $C_3H_5-OH$, $C_3H_5-OH$, $C_3H_5-OH$, $C_3H_5-OH$, $C_3H_5-O-CH_3$, $C_3H_5-O-CH_3$, $C_3H_5-O-CH_3$, $C_3H_5-O-CH_3$, $C_3H_5-O-C_2H_5$, $C_3H_{15}-O-C_2H_5$, $C_3H_5-O-C_2H_5$, $C_3H_5-O-C_3H_7$, $C_3H_5-O-C_3H_7$, $C_3H_5-O-C_4H_9$, $C_6H_5-OH$, $C_6H_5-OH$, $C_6H_5-OH$, $C_6H_5-OH$, $C_6H_5-O-CH_3$, $C_6H_5-O-CH_3$, $C_6H_5-O-CH_3$, $C_6H_5-O-CH_3$, $C_6H_5-O-C_2H_5$, $C_6H_5-O-C_2H_5$, $C_6H_5-O-C_2H_5$, $C_6H_5-O-C_3H_7$, $C_6H_5-O-C_3H_7$, $C_6H_5-O-C_4H_9$, $CH_3SH$, $C_2H_5SH$, $C_3H_7SH$, $C_4H_9SH$, $CH_3-S-CH_3$, $C_2H_5-S-CH_3$, $C_3H_7-S-CH_3$, $C_4H_9-S-CH_3$, $C_2H_5-S-C_2H_5$, $C_3H_7-S-C_2H_5$, $C_4H_9-S-C_2H_5$, $C_3H_7-S-C_3H_7$, $C_4H_9-S-C_3H_7$, $C_4H_9-S-C_4H_9$, $CH_2=CH-SH$, $CH_2=CH-SH$, $CH_2=CH-SH$, $CH_2=CH-SH$, $CH_2=CH-S-CH_3$, $CH_2=CH-S-CH_3$, $CH_2=CH-S-CH_3$, $CH_2=CH-S-CH_3$, $CH_2=CH-S-C_2H_5$, $CH_2=CH-S-C_2H_5$, $CH_2=CH-S-C_2H_5$, $CH_2=CH-S-C_3H_7$, $CH_2=CH-S-C_3H_7$, $CH_2=CH-S-C_4H_9$, $C_3H_5-SH$, $C_3H_5-SH$, $C_3H_5-SH$, $C_3H_5-SH$, $C_3H_5-S-CH_3$, $C_3H_5-S-CH_3$, $C_3H_5-S-CH_3$, $C_3H_5-S-CH_3$, $C_3H_5-S-C_2H_5$, $C_3H_5-S-C_2H_5$, $C_3H_5-S-C_2H_5$, $C_3H_5-S-C_3H_7$, $C_3H_5-S-C_3H_7$, $C_3H_5-S-C_4H_9$, $C_6H_5-SH$, $C_6H_5-SH$, $C_6H_5-SH$, $C_6H_5-SH$, $C_6H_5-S-CH_3$, $C_6H_5-S-CH_3$, $C_6H_5-S-CH_3$, $C_6H_5-S-CH_3$, $C_6H_5-S-C_2H_5$, $C_6H_5-S-C_2H_5$, $C_6H_5-S-C_2H_5$, $C_6H_5-S-C_3H_7$, $C_6H_5-S-C_3H_7$, $C_6H_5-S-C_4H_9$, or so on, but is not limited thereto.

In some embodiments, the adsorption inhibitor AI may be a compound having a structure of $D_m(RR'R'')$, wherein D is nitrogen (N), phosphorus (P), arsenic (As), antimony (Sb), or bismuth (Bi), m is 1 or 2, R, R', and R'' are each independently hydrogen, an alkyl group having 1 to 10 carbons, an alkenyl group having 2 to 10 carbons, an alkynyl group having 2 to 10 carbons, an aryl group having 6 to 15 carbons, a cycloalkyl group having 3 to 12 carbons, or a cycloalkenyl group having 3 to 12 carbons, R, R', and R" are not hydrogen at the same time, and two or more of R, R', and R" may be linked to each other to form a ring.

The adsorption inhibitor AI may include, for example, NH$_2$(CH$_3$), NH$_2$(C$_2$H$_5$), NH$_2$(C$_3$H$_7$), NH$_2$(C$_4$H$_9$), NH(CH$_3$)$_2$, NH(CH$_3$)(C$_2$H$_5$), NH(CH$_3$) (C$_3$H$_7$), NH(CH$_3$)(C$_4$H$_9$), NH(C$_2$H$_5$)$_2$, NH(C$_2$H$_5$)(C$_3$H$_7$), NH(C$_2$H$_5$)(C$_4$H$_9$), NH(C$_3$H$_7$)$_2$, NH(C$_3$H$_7$)(C$_4$H$_9$), NH(C$_4$H$_9$)$_2$, N(CH$_3$)$_3$, N(CH$_3$)$_2$(C$_2$H$_5$), N(CH$_3$)$_2$(C$_3$H$_7$), N(CH$_3$)$_2$(C$_4$H$_9$), N(CH$_3$) (C$_2$H$_5$)$_2$, N(CH$_3$) (C$_2$H$_5$)(C$_3$H$_7$), N(CH$_3$)(C$_2$H$_5$)(C$_4$H$_9$), N(CH$_3$)(C$_3$H$_7$)$_2$, N(CH$_3$)(C$_3$H$_7$)(C$_4$H$_9$), N(CH$_3$)(C$_4$H$_9$)$_2$, N(C$_2$H$_5$)$_3$, N(C$_2$H$_5$)$_2$(C$_3$H$_7$), N(C$_2$H$_5$)$_2$(C$_4$H$_9$), N(C$_2$H$_5$) (C$_3$H$_7$)$_2$, N(C$_2$H$_5$)(C$_3$H$_7$)(C$_4$H$_9$), N(C$_2$H$_5$)(C$_4$H$_9$)$_2$, N(C$_3$H$_7$)$_3$, N(C$_3$H$_7$)$_2$(C$_4$H$_9$), N(C$_3$H$_7$)(C$_4$H$_9$)$_2$, N(C$_4$H$_9$)$_3$, NH$_2$(C$_2$H$_3$), NH$_2$(C$_3$H$_5$), NH$_2$(C$_4$H$_7$), NH(CH$_3$)(C$_2$H$_3$), NH(CH$_3$)(C$_3$H$_5$), NH(CH$_3$)(C$_4$H$_7$), NH(C$_2$H$_3$)$_2$, NH(C$_2$H$_3$)(C$_3$H$_7$), NH(C$_2$H$_5$)(C$_3$H$_5$), NH(C$_2$H$_3$)(C$_3$H$_5$), NH(C$_2$H$_3$)(C$_4$H$_9$), NH(C$_2$H$_5$)(C$_4$H$_7$), NH(C$_2$H$_3$)(C$_4$H$_7$), NH(C$_3$H$_5$)$_2$, NH(C$_3$H$_5$)(C$_4$H$_9$), NH(C$_3$H$_7$)(C$_4$H$_7$), NH(C$_3$H$_5$)(C$_4$H$_7$), NH(C$_4$H$_7$)$_2$, N(CH$_3$)$_2$(C$_2$H$_3$), N(CH$_3$)$_2$(C$_3$H$_5$), N(CH$_3$)$_2$(C$_4$H$_7$), N(CH$_3$)(C$_2$H$_3$)$_2$, N(CH$_3$)(C$_2$H$_3$)(C$_3$H$_7$), N(CH$_3$)(C$_2$H$_5$)(C$_3$H$_5$), N(CH$_3$)(C$_2$H$_3$)(C$_3$H$_5$), N(CH$_3$)(C$_2$H$_3$)(C$_4$H$_9$), N(CH$_3$)(C$_2$H$_5$)(C$_4$H$_7$), N(CH$_3$)(C$_2$H$_3$)(C$_4$H$_7$), N(CH$_3$)(C$_3$H$_5$)$_2$, N(CH$_3$)(C$_3$H$_5$)(C$_4$H$_9$), N(CH$_3$)(C$_3$H$_7$)(C$_4$H$_7$), N(CH$_3$)(C$_4$H$_7$)$_2$, N(C$_2$H$_3$)$_3$, N(C$_2$H$_3$)$_2$(C$_3$H$_7$), N(C$_2$H$_5$)$_2$(C$_3$H$_5$), N(C$_2$H$_3$)$_2$(C$_3$H$_5$), N(C$_2$H$_3$)$_2$(C$_4$H$_9$), N(C$_2$H$_5$)$_2$(C$_4$H$_7$), N(C$_2$H$_3$)$_2$(C$_4$H$_7$), N(C$_2$H$_3$)(C$_3$H$_7$)$_2$, N(C$_2$H$_5$)(C$_3$H$_5$)$_2$, N(C$_2$H$_3$) (C$_3$H$_5$)$_2$, N(C$_2$H$_5$)(C$_3$H$_7$)(C$_4$H$_7$), N(C$_2$H$_5$)(C$_3$H$_5$)(C$_4$H$_9$), N(C$_2$H$_3$) (C$_3$H$_7$)(C$_4$H$_9$), N(C$_2$H$_5$)(C$_3$H$_5$)(C$_4$H$_7$), N(C$_2$H$_3$)(C$_3$H$_7$) (C$_4$H$_7$), N(C$_2$H$_3$)(C$_3$H$_5$)(C$_4$H$_9$), N(C$_2$H$_3$)(C$_3$H$_5$)(C$_4$H$_7$), N(C$_2$H$_3$)(C$_4$H$_9$)$_2$, N(C$_2$H$_5$)(C$_4$H$_7$)$_2$, N(C$_2$H$_3$)(C$_4$H$_7$)$_2$, N(C$_3$H$_5$)$_3$, N(C$_3$H$_5$)$_2$(C$_4$H$_9$), N(C$_3$H$_7$)$_2$(C$_4$H$_7$), N(C$_3$H$_5$)$_2$ (C$_4$H$_7$), N(C$_3$H$_5$)(C$_4$H$_9$)$_2$, N(C$_3$H$_7$)(C$_4$H$_7$)$_2$, N(C$_3$H$_5$) (C$_4$H$_7$)$_2$, N(C$_4$H$_7$)$_3$, NH(CH$_3$)(C$_5$H$_6$), NH(C$_2$H$_5$)(C$_5$H$_6$), NH(C$_3$H$_7$)(C$_5$H$_6$), NH(C$_4$H$_9$)(C$_5$H$_6$), N(CH$_3$)$_2$(C$_5$H$_6$), N(CH$_3$)(C$_2$H$_5$)(C$_5$H$_6$), N(CH$_3$)(C$_3$H$_7$)(C$_5$H$_6$), N(CH$_3$)(C$_4$H$_9$)(C$_5$H$_6$), N (C$_2$H$_5$)$_2$(C$_5$H$_6$), N(C$_2$H$_5$)(C$_3$H$_7$)(C$_5$H$_6$), N(C$_2$H$_5$)(C$_4$H$_9$)(C$_5$H$_6$), N(C$_3$H$_7$)$_2$(C$_5$H$_6$), N(C$_3$H$_7$)(C$_4$H$_9$) (C$_5$H$_6$), N(C$_4$H$_9$)$_2$(C$_5$H$_6$), PH$_2$(CH$_3$), PH$_2$(C$_2$H$_5$), PH$_2$ (C$_3$H$_7$), PH$_2$(C$_4$H$_9$), PH(CH$_3$)$_2$, PH(CH$_3$)(C$_2$H$_5$), PH(CH$_3$) (C$_3$H$_7$), PH(CH$_3$)(C$_4$H$_9$), PH(C$_2$H$_5$)$_2$, PH(C$_2$H$_5$)(C$_3$H$_7$), PH(C$_2$H$_5$)(C$_4$H$_9$), PH(C$_3$H$_7$)$_2$, PH(C$_3$H$_7$)(C$_4$H$_9$), PH(C$_4$H$_9$)$_2$, P(CH$_3$)$_3$, P(CH$_3$)$_2$(C$_2$H$_5$), P(CH$_3$)$_2$(C$_3$H$_7$), P(CH$_3$)$_2$(C$_4$H$_9$), P(CH$_3$)(C$_2$H$_5$)$_2$, P(CH$_3$))(C$_2$H$_5$)(C$_3$H$_7$), P(CH$_3$)(C$_2$H$_5$)(C$_4$H$_9$), P(CH$_3$)(C$_3$H$_7$)$_2$, P(CH$_3$)(C$_3$H$_7$) (C$_4$H$_9$), P(CH$_3$)(C$_4$H$_9$)$_2$, P(C$_2$H$_5$)$_3$, P(C$_2$H$_5$)$_2$(C$_3$H$_7$), P(C$_2$H$_5$)$_2$(C$_4$H$_9$), P(C$_2$H$_5$)(C$_3$H$_7$)$_2$, P(C$_2$H$_5$)(C$_3$H$_7$)(C$_4$H$_9$), P(C$_2$H$_5$)(C$_4$H$_9$)$_2$, P(C$_3$H$_7$)$_3$, P(C$_3$H$_7$)$_2$(C$_4$H$_9$), P(C$_3$H$_7$) (C$_4$H$_9$)$_2$, P(C$_4$H$_9$)$_3$, or so on, but is not limited thereto.

In some embodiments, the adsorption inhibitor AI may be a compound having a structure of X$_1$-QO—X$_2$, X$_1$-QO$_2$—X$_2$, or (QO)X$_1$X$_2$X$_3$, wherein Q is oxygen (O), sulfur (S), selenium (Se), tellurium (Te), polonium (Po), nitrogen (N), phosphorus (P), arsenic (As), antimony (Sb), or bismuth (Bi), and X$_1$, X$_2$, and X$_3$ are each independently hydrogen, an alkyl group having 1 to 10 carbons, an alkenyl group having 2 to 10 carbons, an alkynyl group having 2 to 10 carbons, an aryl group having 6 to 15 carbons, a cycloalkyl group having 3 to 12 carbons, a cycloalkenyl group having 3 to 12 carbons, —OR, —NR$_1$R$_1$', or —SR$_1$, and at least one of X$_1$, X$_2$, and X$_3$ is not hydrogen, and at least two of X$_1$, X$_2$, and X$_3$ may be linked to each other to form a ring, and R$_1$ and R$_1$' are each independently hydrogen, an alkyl group having 1 to 5 carbons, an alkenyl group having 2 to 5 carbons, an alkynyl group having 2 to 5 carbons, an aryl group having 6 to 10 carbons, a cycloalkyl group having 3 to 7 carbons, or a cycloalkenyl group having 3 to 7 carbons.

The adsorption inhibitor AI may include, for example, CH$_3$(SO)H, C$_2$H$_5$(SO)H, C$_3$H$_7$(SO)H, C$_4$H$_9$(SO)H, CH$_3$—(SO)—CH$_3$, C$_2$H$_5$—(SO)—CH$_3$, C$_3$H$_7$—(SO)—CH$_3$, C$_4$H$_9$—(SO)—CH$_3$, C$_2$H$_5$—(SO)—C$_2$H$_5$, C$_3$H$_7$—(SO)—C$_2$H$_5$, C$_4$H$_9$—(SO)—C$_2$H$_5$, C$_3$H$_7$—(SO)—C$_3$H$_7$, C$_4$H$_9$—(SO)—C$_3$H$_7$, C$_4$H$_9$—(SO)—C$_4$H$_9$, CH$_2$=CH—(SO)H, CH$_2$=CH—(SO)H, CH$_2$=CH—(SO)H, CH$_2$=CH—(SO) H, CH$_2$=CH—(SO)—CH$_3$, CH$_2$=CH—(SO)—CH$_3$, CH$_2$=CH—(SO)—CH$_3$, CH$_2$=CH—(SO)—CH$_3$, CH$_2$=CH—(SO)—C$_2$H$_5$, CH$_2$=CH—(SO)—C$_2$H$_5$, CH$_2$=CH—(SO)—C$_2$H$_5$, CH$_2$=CH—(SO)—C$_3$H$_7$, CH$_2$=CH—(SO)—C$_3$H$_7$, CH$_2$=CH—(SO)—C$_4$H$_9$, C$_3$H$_5$—(SO)H, C$_3$H$_5$—(SO)H, C$_3$H$_5$—(SO)H, C$_3$H$_5$—(SO) H, C$_3$H$_5$—(SO)—CH$_3$, C$_3$H$_5$—(SO)—CH$_3$, C$_3$H$_5$—(SO)—CH$_3$, C$_3$H$_5$—(SO)—CH$_3$, C$_3$H$_5$—(SO)—C$_2$H$_5$, C$_3$H$_5$—(SO)—C$_2$H$_5$, C$_3$H$_5$—(SO)—C$_2$H$_5$, C$_3$H$_5$—(SO)—C$_3$H$_7$, C$_3$H$_5$—(SO)—C$_3$H$_7$, C$_3$H$_5$—(SO)—C$_4$H$_9$, C$_6$H$_5$—(SO)H, C$_6$H$_5$—(SO)H, C$_6$H$_5$—(SO)H, C$_6$H$_5$—(SO)H, C$_6$H$_5$—(SO)—CH$_3$, C$_6$H$_5$—(SO)—CH$_3$, C$_6$H$_5$—(SO)—CH$_3$, C$_6$H$_5$—(SO)—CH$_3$, C$_6$H$_5$—(SO)—C$_2$H$_5$, C$_6$H$_5$—(SO)—C$_2$H$_5$, C$_6$H$_5$—(SO)—C$_2$H$_5$, C$_6$H$_5$—(SO)—C$_3$H$_7$, C$_6$H$_5$—(SO)—C$_3$H$_7$, C$_6$H$_5$—(SO)—C$_4$H$_9$, CH$_3$(SO$_2$)H, C$_2$H$_5$(SO$_2$)H, C$_3$H$_7$(SO$_2$)H, C$_4$H$_9$(SO$_2$)H, CH$_3$—(SO$_2$)—CH$_3$, C$_2$H$_5$—(SO$_2$)—CH$_3$, C$_3$H$_7$—(SO$_2$)—CH$_3$, C$_4$H$_9$—(SO$_2$)—CH$_3$, C$_2$H$_5$—(SO$_2$)—C$_2$H$_5$, C$_3$H$_7$—(SO$_2$)—C$_2$H$_5$, C$_4$H$_9$—(SO$_2$)—C$_2$H$_5$, C$_3$H$_7$—(SO$_2$)—C$_3$H$_7$, C$_4$H$_9$—(SO$_2$)—C$_3$H$_7$, C$_4$H$_9$—(SO$_2$)—C$_4$H$_9$, CH$_2$=CH—(SO$_2$)H, CH$_2$=CH—(SO$_2$)H, CH$_2$=CH—(SO$_2$)H, CH$_2$=CH—(SO$_2$)H, CH$_2$=CH—(SO$_2$)—CH$_3$, CH$_2$=CH—(SO$_2$)—CH$_3$, CH$_2$=CH—(SO$_2$)—CH$_3$, CH$_2$=CH—(SO$_2$)—CH$_3$, CH$_2$=CH—(SO$_2$)—C$_2$H$_5$, CH$_2$=CH—(SO$_2$)—C$_2$H$_5$, CH$_2$=CH—(SO$_2$)—C$_2$H$_5$, CH$_2$=CH—(SO$_2$)—C$_3$H$_7$, CH$_2$=CH—(SO$_2$)—C$_3$H$_7$, CH$_2$=CH—(SO$_2$)—C$_4$H$_9$, C$_3$H$_5$—(SO$_2$)H, C$_3$H$_5$—(SO$_2$)H, C$_3$H$_5$—(SO$_2$)H, C$_3$H$_5$—(SO$_2$)H, C$_3$H$_5$—(SO$_2$)—CH$_3$, C$_3$H$_5$—(SO$_2$)—CH$_3$, C$_3$H$_5$—(SO$_2$)—CH$_3$, C$_3$H$_5$—(SO$_2$)—CH$_3$, C$_3$H$_5$—(SO$_2$)—C$_2$H$_5$, C$_3$H$_5$—(SO$_2$)—C$_2$H$_5$, C$_3$H$_5$—(SO$_2$))—C$_2$H$_5$, C$_3$H$_5$—(SO$_2$)—C$_3$H$_7$, C$_3$H$_5$—(SO$_2$)—C$_3$H$_7$, C$_3$H$_5$—(SO$_2$)—C$_4$H$_9$, C$_6$H$_5$—(SO$_2$)H, C$_6$H$_5$—(SO$_2$)H, C$_6$H$_5$—(SO$_2$)H, C$_6$H$_5$—(SO$_2$)H, C$_6$H$_5$—(SO$_2$)—CH$_3$, C$_6$H$_5$—(SO$_2$)—CH$_3$, C$_6$H$_5$—(SO$_2$)—CH$_3$, C$_6$H$_5$—(SO$_2$)—CH$_3$, C$_6$H$_5$—(SO$_2$)—C$_2$H$_5$, C$_6$H$_5$—(SO$_2$)—C$_2$H$_5$, C$_6$H$_5$—(SO$_2$)—C$_2$H$_5$, C$_6$H$_5$—(SO$_2$)—C$_3$H$_7$, C$_6$H$_5$—(SO$_2$)—C$_4$H$_9$, (NO)H$_2$(CH$_3$), (NO)H$_2$(C$_2$H$_5$), (NO) H$_2$(C$_3$H$_7$), (NO)H$_2$(C$_4$H$_9$), (NO)H(CH$_3$)$_2$, (NO)H(CH$_3$) (C$_2$H$_5$), (NO)H(CH$_3$)(C$_3$H$_7$), (NO)H(CH$_3$)(C$_4$H$_9$), (NO)H (C$_2$H$_5$)$_2$, (NO)H(C$_2$H$_5$)(C$_3$H$_7$), (NO)H(C$_2$H$_5$)(C$_4$H$_9$), (NO) H(C$_3$H$_7$)$_2$, (NO)H(C$_3$H$_7$)(C$_4$H$_9$), (NO)H(C$_4$H$_9$)$_2$, (NO) (CH$_3$)$_3$, (NO)(CH$_3$)$_2$(C$_2$H$_5$), (NO)(CH$_3$)$_2$(C$_3$H$_7$), (NO) (CH$_3$)$_2$(C$_4$H$_9$), (NO)(CH$_3$)(C$_2$H$_5$)$_2$, (NO)(CH$_3$)(C$_2$H$_5$) (C$_3$H$_7$), (NO)(CH$_3$)(C$_2$H$_5$)(C$_4$H$_9$), (NO)(CH$_3$)(C$_3$H$_7$)$_2$, (NO)(CH$_3$)(C$_3$H$_7$)(C$_4$H$_9$), (NO)(CH$_3$)(C$_4$H$_9$)$_2$, (NO) (C$_2$H$_5$)$_3$, (NO)(C$_2$H$_5$)$_2$(C$_3$H$_7$), (NO)(C$_2$H$_5$)$_2$(C$_4$H$_9$), (NO) (C$_2$H$_5$)(C$_3$H$_7$)$_2$, (NO)(C$_2$H$_5$)(C$_3$H$_7$)(C$_4$H$_9$), (NO)(C$_2$H$_5$) (C$_4$H$_9$)$_2$, (NO)(C$_3$H$_7$)$_3$, (NO)(C$_3$H$_7$)$_2$(C$_4$H$_9$), (NO)(C$_3$H$_7$) (C$_4$H$_9$)$_2$, (NO)(C$_4$H$_9$)$_3$, (PO)H$_2$(CH$_3$), (PO)H$_2$(C$_2$H$_5$), (PO) H$_2$(C$_3$H$_7$), (PO)H$_2$(C$_4$H$_9$), (PO)H(CH$_3$)$_2$, (PO)H(CH$_3$) (C$_2$H$_5$), (PO)H(CH$_3$)(C$_3$H$_7$), (PO)H(CH$_3$)(C$_4$H$_9$), (PO)H (C$_2$H$_5$)$_2$, (PO)H(C$_2$H$_5$)(C$_3$H$_7$), (PO)H(C$_2$H$_5$)(C$_4$H$_9$), (PO)H (C$_3$H$_7$)$_2$, (PO)H(C$_3$H$_7$)(C$_4$H$_9$), (PO)H(C$_4$H$_9$)$_2$, (PO)(CH$_3$)$_3$, (PO)(CH$_3$)$_2$(C$_2$H$_5$), (PO)(CH$_3$)$_2$(C$_3$H$_7$), (PO)(CH$_3$)$_2$(C$_4$H$_9$), (PO)(CH$_3$)(C$_2$H$_5$)$_2$, (PO)(CH$_3$)(C$_2$H$_5$)(C$_3$H$_7$), (PO)(CH$_3$) (C$_2$H$_5$)(C$_4$H$_9$), (PO)(CH$_3$)(C$_3$H$_7$)$_2$, (PO)(CH$_3$)(C$_3$H$_7$) (C$_4$H$_9$), (PO)(CH$_3$)(C$_4$H$_9$)$_2$, (PO) (C$_2$H$_5$)$_3$, (PO)(C$_2$H$_5$)$_2$ (C$_3$H$_7$), (PO)(C$_2$H$_5$)$_2$(C$_4$H$_9$), (PO)(C$_2$H$_5$)(C$_3$H$_7$)$_2$, (PO)

$(C_2H_5)(C_3H_7)(C_4H_9)$, $(PO)(C_2H_5)(C_{41}H_9)_2$, $(PO)(C_3H_7)_3$, $(PO)(C_3H_7)_2(C_4H_9)$, $(PO)(C_3H_7)(C_4H_9)_2$, $(PO)(C_4H_9)_3$, or so on, but is not limited thereto.

In some embodiments, the adsorption inhibitor AI may be a compound having a structure of R—CN, wherein R is hydrogen, an alkyl group having 1 to 10 carbons, an alkenyl group having 2 to 10 carbons, an alkynyl group having 2 to 10 carbons, an aryl group having 6 to 15 carbons, a cycloalkyl group having 3 to 12 carbons, or a cycloalkenyl group having 3 to 12 carbons.

The adsorption inhibitor AI may include, for example, HCN, $CH_3CN$, $C_2H_5CN$, $C_3H_7CN$, $C_4H_9CN$, $C_5H_{11}CN$, $C_2H_3CN$, $C_3H_5CN$, $C_4H_7CN$, $C_6H_5CN$, $C_2HCN$, $C_3H_3CN$, $C_4H_5CN$, or so on, but is not limited thereto.

In some embodiments, the adsorption inhibitor AI may be a compound including a heteroaromatic ring including at least one selected from a group consisting of nitrogen (N), oxygen (O), and sulfur (S). For example, the adsorption inhibitor AI may be at least one selected from a group consisting of pyridine, pyrimidine, pyrazine, pyrrole, imidazole, oxazole, thiophene, and derivatives thereof.

In some embodiments, the adsorption inhibitor AI may be a compound having a structure of $X_1$—C(=O)—$X_2$ or $X_1$—C(=S)—$X_2$, wherein $X_1$ and $X_2$ are each independently hydrogen, an alkyl group having 1 to 10 carbons, an alkenyl group having 2 to 10 carbons, an alkynyl group having 2 to 10 carbons, an aryl group having 6 to 15 carbons, a cycloalkyl group having 3 to 12 carbons, a cycloalkenyl group having 3 to 12 carbons, —OR, —$NR_1R_1'$, or —$SR_1$, and $X_1$ and $X_2$ are not hydrogen at the same time, $X_1$ and $X_2$ may be linked to each other to form a ring, and $R_1$ and $R_1'$ are each independently hydrogen, an alkyl group having 1 to 5 carbons, an alkenyl group having 2 to 5 carbons, an alkynyl group having 2 to 5 carbons, an aryl group having 6 to 10 carbons, a cycloalkyl group having 3 to 7 carbons, or a cycloalkenyl group having 3 to 7 carbons.

The adsorption inhibitor AI may include, for example, $CH_3CHO$, $C_2H_5CHO$, $C_3H_7CHO$, $C_4H_9CHO$, $CH_3$—CO—$CH_3$, $C_2H_{15}$—CO—$CH_3$, $C_3H_7$—CO—$CH_3$, $C_4H_9$—CO—$CH_3$, $C_2H_5$—CO—$C_2H_5$, $C_3H_7$—CO—$C_2H_5$, $C_4H_9$—CO—$C_2H_5$, $C_3H_7$—CO—$C_3H_7$, $C_4H_9$—CO—$C_3H_7$, $C_4H_9$—CO—$C_4H_9$, $CH_2$=CH—CHO, $CH_2$=CH—CHO, $CH_2$=CH—CHO, $CH_2$=CH—CHO, $CH_2$=CH—CO—$CH_3$, $CH_2$=CH—CO—$CH_3$, $CH_2$=CH—CO—$CH_3$, $CH_2$=CH—CO—$CH_3$, $CH_2$=CH—CO—$C_2H_5$, $CH_2$=CH—CO—$C_2H_5$, $CH_2$=CH—CO—$C_2H_5$, $CH_2$=CH—CO—$C_3H_7$, $CH_2$=CH—CO—$C_3H_7$, $CH_2$=CH—CO—$C_4H_9$, $C_3H_5$—CHO, $C_3H_5$—CHO, $C_3H_5$—CHO, $C_3H_5$—CHO, $C_3H_5$—CO—$CH_3$, $C_3H_5$—CO—$CH_3$, $C_3H_5$—CO—$CH_3$, $C_3H_5$—CO—$CH_3$, $C_3H_5$—CO—$C_2H_5$, $C_3H_5$—CO—$C_2H_5$, $C_3H_5$—CO—$C_{21}$—$H_5$, $C_3H_5$—CO—$C_3H_7$, $C_3H_5$—CO—$C_3H_7$, $C_3H_5$—CO—$C_4H_9$, $C_6H_5$—CHO, $C_6H_5$—CHO, $C_6H_5$—CHO, $C_6H_5$—CHO, $C_6H_5$—CO—$CH_3$, $C_6H_5$—CO—$CH_3$, $C_6H_5$—CO—$CH_3$, $C_6H_5$—CO—$CH_3$, $C_6H_5$—CO—$C_2H_5$, $C_6H_5$—CO—$C_2H_5$, $C_6H_5$—CO—$C_2H_5$, $C_6H_5$—CO—$C_3H_7$, $C_6H_5$—CO—$C_3H_7$, $C_6H_5$—CO—$C_4H_9$, $CH_3CHS$, $C_2H_5CHS$, $C_3H_7CHS$, $C_4H_9CHS$, $CH_3$—CS—$CH_3C_2H_5$—CS—$CH_3$, $C_3H_7$—CS—$CH_3$, $C_4H_9$—CS—$CH_3$, $C_2H_5$—CS—$C_2H_5$, $C_3H_7$—CS—$C_2H_5$, $C_4H_9$—CS—$C_2H_5$, $C_3H_7$—CS—$C_3H_7$, $C_4H_9$—CS—$C_3H_7$, $C_4H_9$—CS—$C_4H_9$, $CH_2$=CH—CHS, $CH_2$=CH—CHS, $CH_2$=CH—CHS, $CH_2$=CH—CHS, $CH_2$=CH—CS—$CH_3$, $CH_2$=CH—CS—$CH_3$, $CH_2$=CH—CS—$CH_3$, $CH_2$=CH—CS—$CH_3$, $CH_2$=CH—CS—$C_2H_5$, $CH_2$=CH—CS—$C_2H_5$, $CH_2$=CH—CS—$C_2H_5$, $CH_2$=CH—CS—$C_3H_7$, $CH_2$=CH—CS—$C_3H_7$, $CH_2$=CH—CS—$C_4H_9$, $C_3H_5$—CHS, $C_3H_5$—CHS, $C_3H_5$—CHS, $C_3H_5$—CHS, $C_3H_5$—CS—$CH_3$, $C_3H_5$—CS—$CH_3$, $C_3H_5$—CS—$CH_3$, $C_3H_5$—CS—$CH_3$, $C_3H_5$—CS—$C_2H_5$, $C_3H_5$—CS—$C_2H_5$, $C_3H_5$—CS—$C_2H_5$, $C_3H_5$—CS—$C_3H_7$, $C_3H_5$—CS—$C_3H_7$, $C_3H_5$—CS—$C_4H_9$, $C_6H_5$—CHS, $C_6H_5$—CHS, $C_6H_5$—CHS, $C_6H_5$—CHS, $C_6H_5$—CS—$CH_3$, $C_6H_5$—CS—$CH_3$, $C_6H_5$—CS—$CH_3$, $C_6H_5$—CS—$CH_3$, $C_6H_5$—CS—$C_2H_5$, $C_6H_5$—CS—$C_2H_5$, $C_6H_5$—CS—$C_2H_5$, $C_6H_5$—CS—$C_3H_7$, $C_6H_5$—CS—$C_3H_7$, $C_6H_5$—CS—$C_4H_9$, or so on, but is not limited thereto.

The above adsorption inhibitor AI may be adsorbed relatively evenly on the entire surface of the substrate 100. The substrate 100 illustrated in FIG. 3A is provided with a recess 105 including a recess sidewall 105w and a recess bottom 105b, and when an aspect ratio of the recess 105 is large, the adsorption inhibitor AI may not be transferred to the recess bottom 105b in the same extent as an entrance of the recess 105. That is, an adsorption density of the adsorption inhibitor AI adjacent (e.g., at) the entrance of the recess 105 may be greater than an adsorption density of the adsorption inhibitor AI at the bottom of the recess 105b. In addition, for a physicochemical reason such as surface energy, adsorption of the adsorption inhibitor AI may be preferred near a boundary where an upper surface of the substrate 100 meets the recess 105.

In some embodiments, the adsorption inhibitor AI may be supplied for about 0.05 seconds to about 3 seconds, about 0.06 seconds to about 2 seconds, about 0.08 seconds to about 1.5 seconds, about 0.1 seconds to about 1 second, or about 0.2 seconds to about 0.8 seconds. When a supply time of the adsorption inhibitor AI is too short, a layer of the adsorption inhibitor AI may not be sufficiently formed, and thus, an effect of supplying the adsorption inhibitor AI may be reduced. When the supply time of the adsorption inhibitor AI is too long, an effect of supplying the adsorption inhibitor AI is saturated, which is economically disadvantageous.

Purge of Excess Amount of Adsorption Inhibitor AI

Thereafter, an excess amount of the adsorption inhibitor AI may be purged with a purge gas in order to remove the excess amount of adsorption inhibitor AI from a surface of the substrate 100 (S22). During the step S22, the adsorption inhibitor AI not adsorbed (e.g., not chemically adsorbed) on the substrate 100 may be purged. The adsorption inhibitor AI not adsorbed on the substrate 100 may be referred to as an excess amount of the adsorption inhibitor AI.

The purge gas may include, for example, helium (He), neon (Ne), argon (Ar), nitrogen ($N_2$), ammonia ($NH_3$), hydrogen ($H_2$), and so on, and may be selected by considering a physical environment at the time of purging and chemical characteristics of the adsorption inhibitor AI to be purged.

The purge may be performed for, for example, about 0.1 seconds to about 5 seconds. In some embodiments, the purge may be performed for about 0.2 seconds to about 4 seconds, about 0.4 seconds to about 3 seconds, or about 0.7 seconds to about 2 seconds. When the purge time is too short, the excess amount of adsorption inhibitor AI may be insufficiently removed. When the purge time is too long, an effect of adsorbing the adsorption inhibitor AI may be reduced.

Adsorption of Metal Precursor

Referring to FIGS. 2 and 3B, a metal precursor MP may be supplied on the substrate 100 to be adsorbed on the substrate 100 (S23).

In this case, the metal precursor MP is not adsorbed to an adsorption site where the adsorption inhibitor AI is already adsorbed. That is, the metal precursor MP is adsorbed to an empty adsorption site to which the adsorption inhibitor AI is not adsorbed.

If the adsorption inhibitor AI has not been adsorbed on the surface of the substrate 100, the metal precursor MP would be intensively adsorbed near the entrance of the recess 105 having a low mass transfer resistance and would be adsorbed very little on the recess bottom 105b having a high mass transfer resistance. However, since the adsorption inhibitor AI is adsorbed near the entrance of the recess 105, a phenomenon in which the metal precursor MP is locally concentrated and adsorbed may be greatly reduced.

In addition, because of the adsorption inhibitor AI adsorbed near the entrance of the recess 105, unadsorbed metal precursors MP may more diffuse to the bottom of the recess 105b to be adsorbed to the bottom of the recess 105b. That is, a difference in adsorption density of the metal precursor MP between the vicinity of the entrance of the recess 105 and the bottom of the recess 105b may be further reduced such that more uniform adsorption may be achieved.

In some embodiments, the metal precursor MP may include a titanium (Ti) precursor. The titanium precursor may include, for example, a titanium compound such as titanium tetrachloride ($TiCl_4$), titanium tetrafluoride ($TiF_4$), titanium tetrakis(isopropoxide) ($Ti(O-iPr)_4$), cyclopentadienyl titanium, titanium bis(isopropoxide) bis(2,2,6,6-tetramethyl-3,5-heptanedionate) ($Ti(O-iPr)_2(thd)_2$), tetrakisdimethylaminotitanium ($Ti[N(CH_3)_2]_4$, TDMAT), tetrakis(diethylamino) titanium (($Et_2N)_4Ti$, TEMAT), or derivatives thereof. However, the inventive concept is not limited thereto.

In some embodiments, the metal precursor MP may include a tantalum (Ta) precursor. The tantalum precursor may include, for example, a tantalum compound such as tantalum pentachloride ($TaCl_5$), tantalum pentafluoride ($TaF_5$), pentakisdimethylaminotantalum ($Ta(N(CH_3)_2)_5$, PDMAT), pentakisdiethylaminotantalum (PDEAT; $Ta(NEt_2)_5$), pentakis (methylethylamido) tantalum (PMEAT; $Ta(NMeEt)_5$), tert-butyliminotris(dimethylamino) tantalum (TBTDMT, $tBuNTa(NMe_2)_3$), tert-butyliminotris(diethylamino) tantalum (TBTDET, $tBuNTa(NEt_2)_3$), tert-butyliminotris(methylethylamino) tantalum (TBTMET, $tBuNTa(NMeEt)_3$), ethylimido-tris(dimethylamido) tantalum ((EtN)Ta$(NMe_2)_3$), ethylimido-tris(diethylamido) tantalum ((EtN)Ta$(NEt_2)_3$), ethylimido-tris(ethylmethylamido) tantalum ((EtN)Ta$[N(Et)Me]_3$), tert-amylimido-tris(dimethylamido) tantalum ((tAmylN)Ta$(NMe_2)_3$ (where tAmyl is a tert-amyl group ($CH_3CH_2C(CH_3)_2$—)), tert-amylimido-tris(diethylamido) tantalum ((tAmylN)Ta$(NEt_2)_3$), tert-amylimido-tris(ethylmethylamido) tantalum ((tAmylN)Ta$[N(Et)Me]_3$), or derivatives thereof. However, the inventive concept is not limited thereto.

In some embodiments, the metal precursor MP may include a tungsten (W) precursor. The tungsten precursor may include, for example, a tungsten compound such as bis(tert-butylimido) bis(tert-butylamido) tungsten (($tBuN)_2W(N(H)tBu)_2$), bis(tert-butylimido) bis(dimethylamido) tungsten (($tBuN)_2W(NMe_2)_2$), bis(tert-butylimido) bis (diethylamido) tungsten (($tBuN)_2W(NEt_2)_2$), bis(tert-butylimido) bis(ethylmethylamido) tungsten (($tBuN)_2W(NEtMe)_2$), tungsten hexafluoride, tungsten hexachloride, or derivatives thereof. However, the inventive concept is not limited thereto.

In some embodiments, the metal precursor MP may include a vanadium (V) precursor. The vanadium precursor may include, for example, a vanadium compound such as vanadium tetrachloride ($VCl_4$), vanadium pentachloride ($VCl_5$), vanadium pentafluoride ($VF_5$), tetrakisdimethylaminovanadium ($V(N(CH_3)_2)_4$, TDMAV), tetrakisdiethylaminovanadium (TDEAV; $V(NEt_2)_4$), tetrakis(methylethylamido) vanadium (TMEAV; $V(NMeEt)_4$), bis(cyclopentadienyl) vanadium ($Cp_2V$), bis(cyclopentadienyl) dichlorovanadium ($Cp_2VCl_2$), or derivatives thereof. However, the inventive concept is not limited thereto.

In some embodiments, the metal precursor MP may include a niobium (Nb) precursor. The niobium precursor may include, for example, a niobium compound such as niobium pentachloride ($NbCl_5$), niobium pentafluoride ($NbF_5$), pentakisdimethylaminoniobium ($Nb(N(CH_3)_2)_5$, PDMAN), pentakisdiethylaminoniobium (PDEAN; $Nb(NEt_2)_5$), pentakis (methylethylamido) niobium (PMEAN; $Nb(NMeEt)_5$), tert-butyliminotris (dimethylamino) niobium (TBTDMN, $tBuNNb(NMe_2)_3$), tert-butyliminotris (diethylamino) niobium (TBTDEN, $tBuNNb(NEt_2)_3$), tert-butyliminotris(methylethylamino) niobium (TBTMEN, $tBuNNb(NMeEt)_3$), ethylimido-tris(dimethyl)amido) niobium ((EtN)Nb$(NMe_2)_3$), ethylimido-tris(diethylamido) niobium((EtN)Nb$(NEt_2)_3$), ethylimido-tris(ethylmethylamido) niobium ((EtN)Nb$[N(Et)Me]_3$), tert-amylimido-tris(dimethylamido) niobium ((tAmylN)Nb$(NMe_2)_3$ (where tAmyl is a tert-amyl group ($CH_3CH_2C(CH_3)_2$—)), tert-amylimido-tris(diethylamido) niobium ((tAmylN)Nb$(NEt_2)_3$), tert-amylimido-tris(ethylmethylamido) niobium ((tAmylN) Nb($[N(Et)Me]_3$), or derivatives thereof. However, the inventive concept is not limited thereto.

In some embodiments, the metal precursor MP may be supplied for about 0.05 seconds to about 3 seconds, about 0.06 seconds to about 2 seconds, about 0.08 seconds to about 1.5 seconds, about 0.1 seconds to about 1 second, or about 0.2 seconds to about 0.8 seconds. When a supply time of the metal precursor MP is too short, the metal precursor MP may not be sufficiently supplied, and thus, a material layer may be slowly formed. When the supply time of the metal precursor MP is too long, an effect of supplying the metal precursor MP is saturated, which is economically disadvantageous.

Purge of Excess Amount of Metal Precursor MP

Thereafter, an excess amount of the metal precursor MP may be purged with a purge gas to remove the excess amount of metal precursor MP from a surface of the substrate 100 (S24). During the step S24, the metal precursor MP not adsorbed (e.g., not chemically adsorbed) on the substrate 100 may be purged. The metal precursor MP not adsorbed on the substrate 100 may be referred to as an excess amount of the metal precursor MP.

The purge gas may include, for example, helium (He), neon (Ne), argon (Ar), nitrogen ($N_2$), ammonia ($NH_3$), hydrogen ($H_2$), or so on, and may be selected by considering a physical environment at the time of purging and chemical characteristics of the metal precursor MP to be purged.

The purge may be performed for, for example, about 0.1 seconds to about 5 seconds. In some embodiments, the purge may be performed for about 0.2 seconds to about 4 seconds, about 0.4 seconds to about 3 seconds, or about 0.7 seconds to about 2 seconds. When a purge time is too short, the excess amount of metal precursor MP may be insufficiently removed. When the purge time is too long, the adsorbed metal precursor MP may partially be desorbed and an effect of adsorbing the metal precursor MP may be reduced.

Supply of Reactant

Referring to FIGS. 2 and 3C, a material layer may be formed by supplying a reactant to a reaction chamber (S25).

Specifically, the reactant supplied to the reaction chamber reacts with the metal precursor to form a material layer. The reactant may include one or more selected from a group consisting of, for example, nitrogen ($N_2$), ammonia ($NH_3$), hydrazine ($N_2H_4$), diazene ($N_2H_2$), $N_2O$, NO, $NO_2$, plasma $N_2$, plasma $NH_3$, plasma $H_2$, and $NF_3$.

As the reactant reacts with the metal precursor, the adsorption inhibitor AI may be removed from a surface of the substrate 100. Although the inventive concept is not limited by a particular theory, the reactant is first adsorbed on the surface of the substrate 100 and then moves along the surface of the substrate 100 and desorbs the adsorption inhibitor AI which is relatively weakly bonded to the substrate 100 and collides with the metal precursor MP to react therewith.

The reactant reacts with a metal element of the metal precursor MP to be converted into a metal nitride, and moiety such as a halogen element or a hydrocarbon ligand bonded to the metal element of the metal precursor is dissociated and removed.

Purge of Excess Amount of Reactant

Thereafter, an excess amount of the metal precursor MP may optionally be purged with a purge gas to remove the excess amount of reactant from a surface of the substrate 100 (S26). During the step S26, the reactant not reacted with the metal precursor MP may be purged. The reactant not reacted with the metal precursor MP may be referred to as an excess amount of the reactant.

The purge gas may include, for example, helium (He), neon (Ne), argon (Ar), nitrogen ($N_2$), ammonia ($NH_3$), hydrogen ($H_2$), or so on, and may be selected by considering a physical environment at the time of purging and chemical characteristics of the reactant to be purged.

The purge may be performed for, for example, about 0.1 seconds to about 5 seconds. In some embodiments, the purge may be performed for about 0.2 seconds to about 4 seconds, about 0.4 seconds to about 3 seconds, or about 0.7 seconds to about 2 seconds. When a purge time is too short, the excess amount of reactant may be insufficiently removed. When the purge time is too long, an effect of purging the reactant is saturated, which is economically disadvantageous.

The adsorption inhibitor AI partially occupies the surface of the substrate 100, and thus, an area (that is, the amount of the metal precursor MP to be adsorbed) where the metal precursor MP is adsorbed on the surface of the substrate 100 is reduced compared to when the adsorption inhibitor AI is not used. This results in a decrease in a growth rate of a material layer such as a metal nitride. However, the material layer may grow more uniformly despite various topography and a high aspect ratio due to presence of the adsorption inhibitor AI.

FIGS. 4A to 4D are schematic views conceptually illustrating a growth of the material layer when the adsorption inhibitor AI is not used.

Figure 4A:
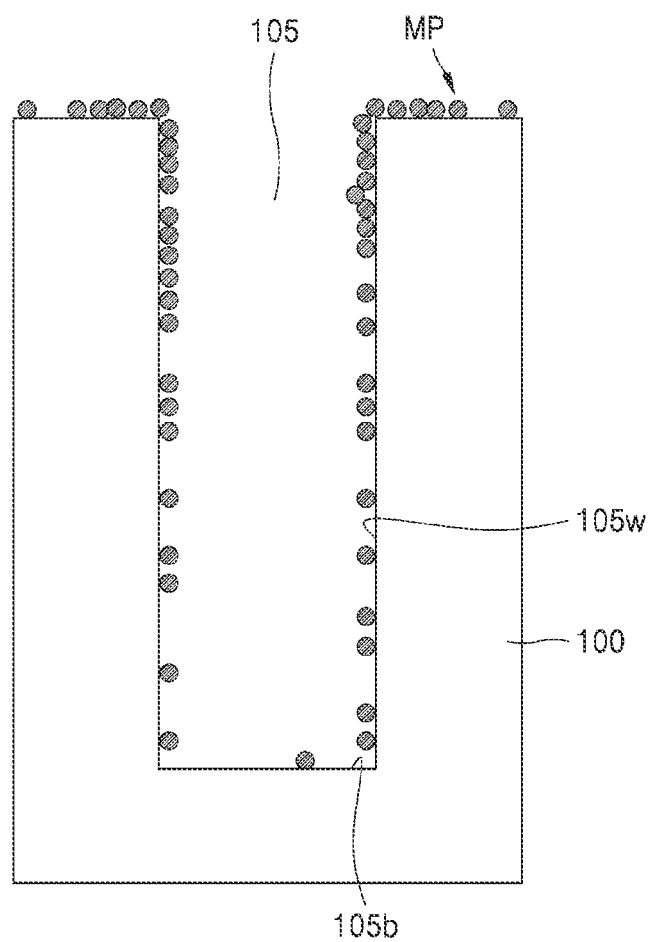
FIGS. 4A to 4D are schematic views conceptually illustrating a growth of a material layer when an adsorption inhibitor is not used.

Referring to FIG. 4A, a monolayer of the metal precursor MP is formed by supplying the metal precursor MP on the substrate 100.

At this time, an adsorption density of the metal precursor MP adjacent (e.g., at) an entrance of the recess 105 is higher than an adsorption density of the inside of the recess 105, particularly a bottom surface thereof due to a diffusion resistance of the metal precursor MP into the recess 105. In addition, in terms of surface energy, the metal precursor MP has a higher adsorption preference at the entrance of the recess than the inside of the recess 105 or other upper surfaces of the substrate 100, and thus, an adsorption density of the metal precursor MP is higher at the entrance of the recess 105 than in the inside of the recess 105, particularly a bottom surface thereof.

A monolayer of the metal precursor MP may be formed by supplying the metal precursor MP on the substrate 100 and then, purging the metal precursor MP (e.g., the metal precursor MP not adsorbed on the substrate 100).

Figure 4B:
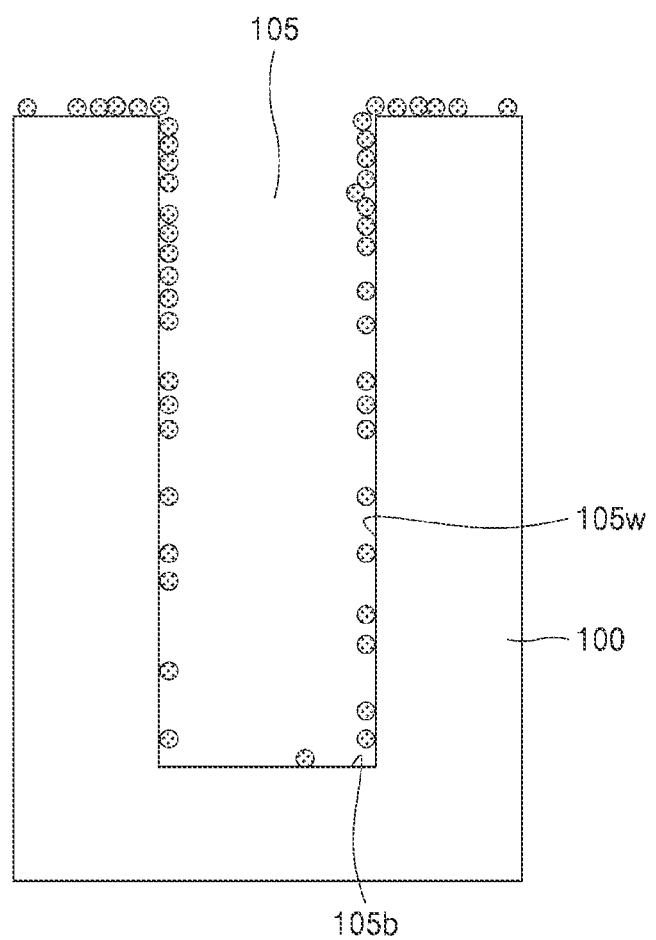

Referring to FIG. 4B, a material layer such as a metal nitride may be obtained by supplying a reactant on the substrate 100.

When a reactant described with reference to FIG. 3C is supplied, the monolayer of the metal precursor MP may be converted into a metal nitride. Thereafter, an excess amount of reactant material may be purged to be removed as necessary.

As illustrated in FIG. 4B, the high adsorption density of the metal precursor MP at the entrance of the recess 105 leads to a high deposition density of a metal nitride at the entrance of the recess 105.

Thereafter, a material layer of a metal nitride MN is grown by repeating a deposition cycle where the processes of FIGS. 4A and 4B are set as one cycle. Hereinafter, processes to be described with reference to FIGS. 4C and 4D correspond to a second deposition cycle that is performed subsequently to the deposition cycle described with reference to FIGS. 4A and 4B.

Figure 4C:
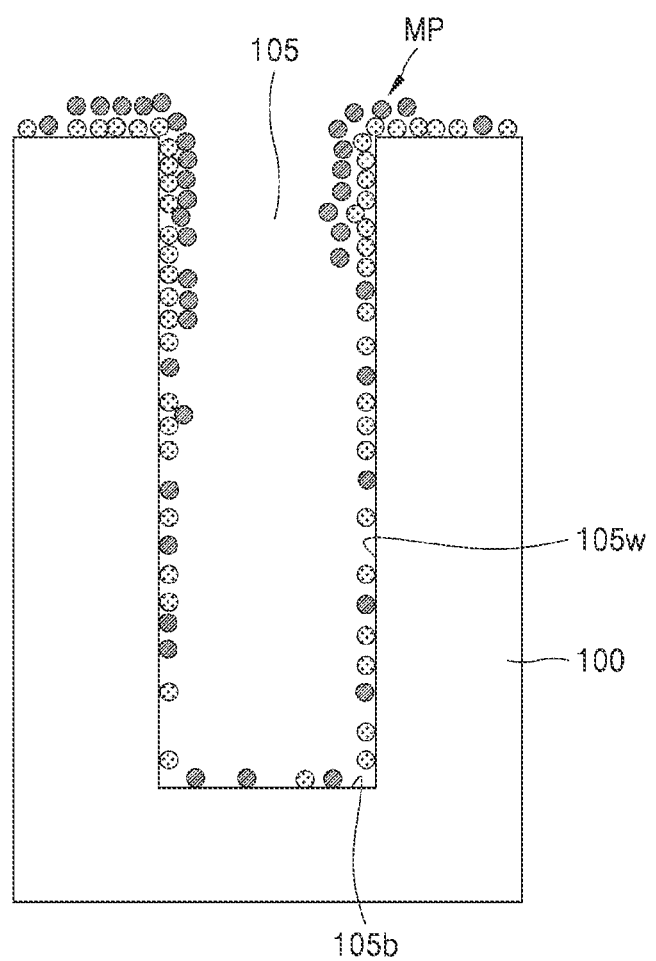

Referring to FIG. 4C, a monolayer of the metal precursor MP is formed by supplying the metal precursor MP on the substrate 100.

Adsorption of the metal precursor MP is preferred at the entrance of the recess 105 for the reason described with reference to FIG. 4A, and thus, the adsorption density of the metal precursor MP at the entrance of the recess 105 is higher than the adsorption density of the inside of the recess 105, particularly a bottom surface thereof.

As a result, there is a region in which the metal nitride MN and the metal precursor MP form two layers at the entrance of the recess 105, whereas the metal nitride MN and the metal precursor (MN) do not completely form even one layer in a lower portion and the bottom surface of the recess 105.

Figure 4D:
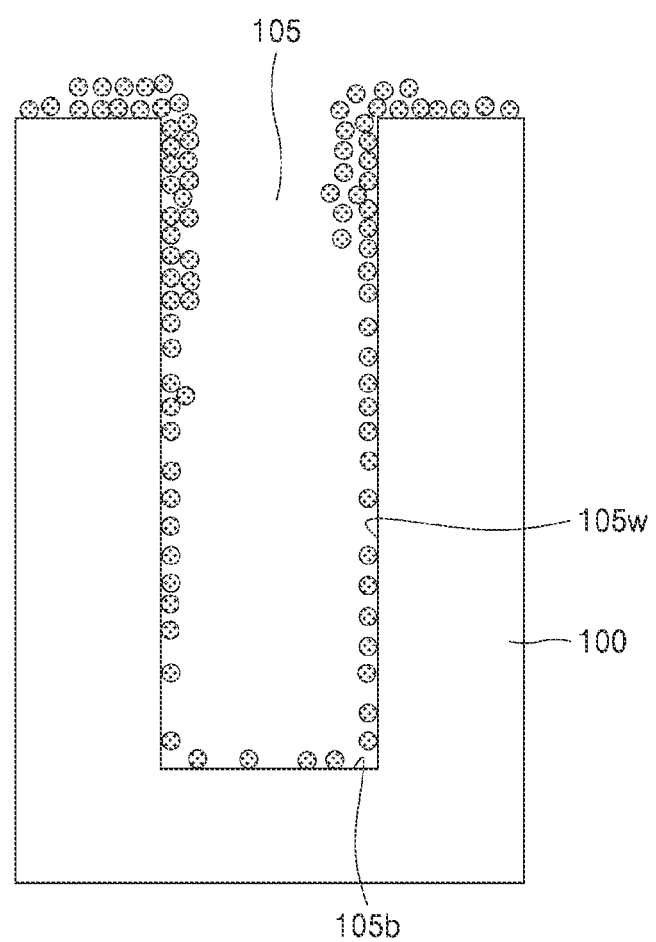

Referring to FIG. 4D, a material layer such as a metal nitride may be obtained by supplying a reactant on the substrate 100.

As described with reference to FIG. 4B, the metal precursor MP adsorbed on the substrate 100 is converted into a material layer such as a metal nitride. As a result, the metal nitride MN is formed to have two layers near the entrance of the recess 105, while the metal nitride MN dos not completely form even one layer in the lower portion and the bottom surface of the recess 105.

As described above, when the adsorption inhibitors AI illustrated in FIGS. 3A to 3C are not used, a growth rate of a material layer (that is, the metal nitride MN) may be accelerated, but uniformity of deposition such as step coverage may be reduced.

Figure 5:
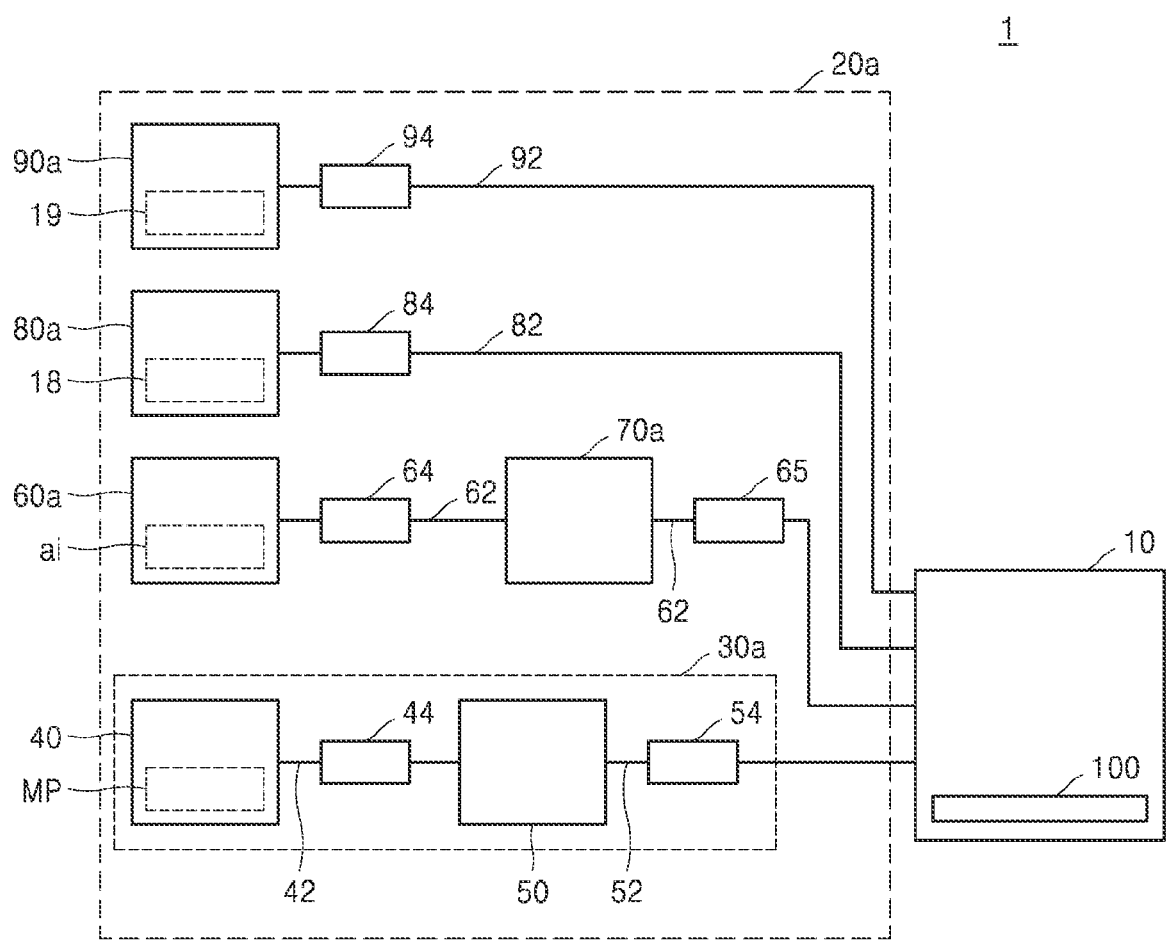
FIG. 5 is a diagram conceptually illustrating semiconductor equipment for performing a method of forming a material layer according to some embodiments of the inventive concept.

FIG. 5 is a diagram conceptually illustrating semiconductor equipment 1 that performs a method of forming a material layer according to some embodiments of the inventive concept.

Referring to FIG. 5, the semiconductor equipment 1 may include a process material supply system 20a that may independently supply the adsorption inhibitor AI, the metal precursor MP, a purge gas 19, and a reactant 18 into a reaction chamber 10.

The process material supply system 20a may be configured to supply the adsorption inhibitor AI, the metal precursor MP, the purge gas 19, and the reactant 18 into the reaction chamber 10 independently of each other and at different time. In some embodiments, the process material supply system 20a may be configured to simultaneously supply two or more of the adsorption inhibitor AI, the metal precursor MP, the purge gas 19, and the reactant material 18 into the reaction chamber 10. The substrate 100 may be loaded into and unloaded from the reaction chamber 10.

The process material supply system 20a may include a metal precursor supply apparatus 30a, an adsorption inhibitor supply apparatus 60a, a purge gas supply apparatus 90a, and a reactant supply apparatus 80a. The metal precursor supply apparatus 30a may supply the metal precursor MP into the reaction chamber 10.

The metal precursor supply apparatus 30a may include a metal precursor storage container 40 and a vaporizer 50. The metal precursor storage container 40 and the vaporizer 50 may be connected by a pipe 42, and a flow control apparatus 44 may be provided in the pipe 42. The vaporizer 50 and the reaction chamber 10 may be connected by a pipe 52, and a flow control apparatus 54 may be provided in the pipe 52.

The metal precursor MP in the metal precursor storage container 40 may be moved to the vaporizer 50 and vaporized by the vaporizer 50. In addition, the metal precursor MP vaporized by the vaporizer 50 may be supplied to the reaction chamber 10.

The adsorption inhibitor supply apparatus 60a may supply the adsorption inhibitor AI into the reaction chamber 10. The adsorption inhibitor AI may be stored in the adsorption inhibitor supply apparatus 60a, and the adsorption inhibitor AI may be supplied from the adsorption inhibitor supply apparatus 60a into the reaction chamber 10 through a pipe 62. In some embodiments, a canister for supplying the adsorption inhibitor AI may be provided in the adsorption inhibitor supply apparatus 60a, and the canister may be configured to constantly supply the adsorption inhibitor AI.

The adsorption inhibitor supply apparatus 60a and the reaction chamber 10 may be connected to each other by a pipe 62, and the pipe 62 may be provided with a flow control apparatus 64 capable of controlling a flow rate of the adsorption inhibitor AI.

The adsorption inhibitor supply apparatus 60a may supply the adsorption inhibitor AI in a liquid state to the flow control apparatus 64, and after a flow rate is controlled by the flow control apparatus 64 to be constant, the adsorption inhibitor AI is vaporized by the vaporizer 70a, and thus, the amount of adsorption inhibitor AI supplied to the reaction chamber 10 may be uniformly controlled. In some embodiments, the adsorption inhibitor AI may be supplied to the reaction chamber 10 after being vaporized by using a bubbler instead of a vaporizer 70a. A temperature of the adsorption inhibitor AI supplied to the reaction chamber 10 may be a room temperature to about 80° C.

The vaporizer 70a and the reaction chamber 10 may be connected to each other by the pipe 62, and a flow rate control apparatus 65 may be provided in the pipe 62. The amount of adsorption inhibitor AI supplied to the reaction chamber 10 may be more uniformly controlled by the flow control apparatus 65.

The reactant supply apparatus 80a may supply the reactant 18 into the reaction chamber 10. The reactant 18 may be stored in the reactant supply apparatus 80a, and the reactant 18 may be supplied from the reactant supply apparatus 80a into the reaction chamber 10 through a pipe 82. The reactant supply apparatus 80a and the reaction chamber 10 may be connected to each other by the pipe 82, and the pipe 82 may be provided with a flow control apparatus 84 capable of controlling a flow rate of the reactant 18.

The purge gas supply apparatus 90a may supply the purge gas 19 into the reaction chamber 10. The purge gas 19 may be stored in the purge gas supply apparatus 90a, and the purge gas 19 may be supplied from the purge gas supply apparatus 90a into the reaction chamber 10 through a pipe 92. The purge gas supply apparatus 90a and the reaction chamber 10 may be connected to each other by the pipe 92, and the pipe 92 may be provided with a flow rate control apparatus 94 capable of controlling a flow rate of the purge gas 19.

The pipes 42, 52, 62, 82, and 92 may be pipes through which a fluid may flow, and the flow control apparatuses 44, 54, 64, 84, and 94 may include a valve system that may control a flow of the fluid.

The adsorption inhibitor AI, the metal precursor MP, and the reactant 18 may each be transported by using a carrier gas. The carrier gas is an inert gas and may include argon, helium, nitrogen, neon, and so on but is not limited thereto. A flow rate of the carrier gas may be appropriately selected by considering factors such as a deposition rate of the material layer, and a vapor pressure or a temperature of a material to be transported and may be, for example, about 200 standard cubic centimeters per minute (sccm) to about 1300 sccm.

FIGS. 6A to 6D are diagrams illustrating timing of supplying the adsorption inhibitor AI, the metal precursor MP, the purge gas 19, and the reactant 18 for forming a material layer, according to some embodiments of the inventive concept. Each of supply materials may be supplied in a pulsed manner in FIGS. 6A to 6D. A supply flow rate and a supply time of each supply material may not be proportional to heights and widths of pulses illustrated in FIGS. 6A to 6D. In addition, although not specifically illustrated in FIGS. 6A to 6D, purge gases for purging may be supplied between pulses of the respective supply materials to remove reaction by-products and/or an excess amount of supply materials inside the reaction chamber.

Figure 6A:
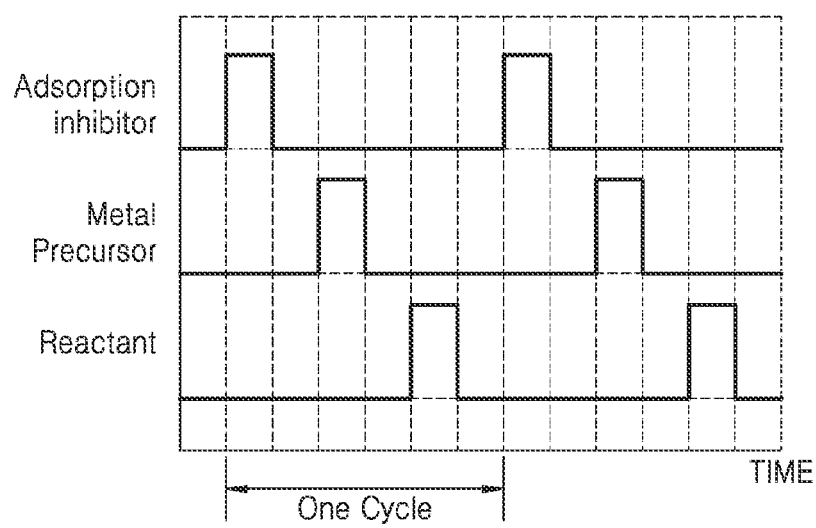
FIGS. 6A to 6D are diagrams illustrating timing of supplying an adsorption inhibitor, a metal precursor, a purge gas, and a reactant for forming a material layer, according to some embodiments of the inventive concept.

Referring to FIG. 6A, after the adsorption inhibitor AI is supplied on the substrate 100, the metal precursor MP may be supplied, and then the reactant 18 may be supplied. In this case, a pulse of the purge gas 19 may be between a pulse of the adsorption inhibitor AI, a pulse of the metal precursor MP, and a pulse of the reactant 18. In addition, the pulse of the adsorption inhibitor AI, the pulse of the metal precursor (MP), and the pulse of the reactant 18 may form one deposition cycle.

First, when the pulse of the adsorption inhibitor AI is supplied on the substrate 100, the adsorption inhibitor AI supplied on a surface of the substrate 100 may be adsorbed onto the substrate 100 by chemical adsorption and/or physical adsorption. Thereafter, purging is performed with the purge gas 19 to remove the physically adsorbed adsorption inhibitor AI or an excess amount of the adsorption inhibitor AI, and thus, a monolayer of the adsorption inhibitor AI chemisorbed on the substrate 100 may be obtained.

In addition, the adsorption inhibitor AI may be adsorbed with a higher adsorption density at a position where a material is more preferred.

Subsequently, when the pulse of the metal precursor MP is supplied on the substrate 100, the metal precursor MP may be adsorbed onto the substrate 100 by avoiding a position where the adsorption inhibitor AI is adsorbed. Thereafter, purging is performed with the purge gas 19 to remove the physically adsorbed metal precursor MP or an excess amount of the metal precursor MP, and thus, a monolayer of the metal precursor MP chemisorbed on the substrate 100 may be obtained.

Because the adsorption inhibitor AI is adsorbed with a high adsorption density at the position where adsorption of a material is more preferred, an adsorption density of the metal precursor MP at this position may be lower than the adsorption density thereof when there is no adsorption inhibitor AI. In addition, because the adsorption inhibitor AI is adsorbed with a low adsorption density at a position where adsorption of a material is less preferred, the adsorption density of the metal precursor MP at this position may not be affected. Accordingly, the adsorption density of the metal precursor MP on the entire surface of the substrate 100 may be more uniform.

Thereafter, when the reactant 18 is supplied into the reaction chamber, the reactant 18 may react with the metal precursor MP to form a metal nitride layer. Thereafter, when purging is performed with the purge gas 19, an excess amount of the reactant 18 or reaction byproducts may be removed.

Although the inventive concept is not limited by a specified theory, the reactant 18 is first adsorbed on a surface of the substrate 100 and then moves along the surface of the substrate 100 and collides with the metal precursor MP to generate a metal nitride. At this time, the adsorbed reactant 18 may collide with the adsorption inhibitor AI, and thereby, the adsorption inhibitor AI may be desorbed from the surface of the substrate 100.

The above-described processes are set as one deposition cycle, and the deposition cycle may be repeated until the metal nitride layer is formed to a desirable thickness. When the deposition cycle is repeated, the step of providing the metal precursor MP may be performed after the step of providing the adsorption inhibitor AI and before the step of supplying the reactant 18.

Figure 6B:
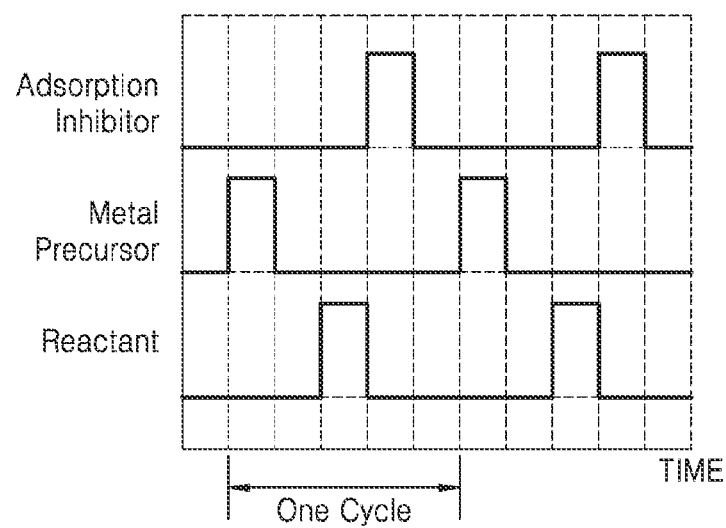

FIG. 6B is a diagram illustrating timing of supplying the adsorption inhibitor AI, the metal precursor MP, the purge gas 19, and the reactant 18 for forming a material layer, according to some embodiments of the inventive concept.

Referring to FIG. 6B, after the metal precursor MP is supplied on the substrate 100, the reactant 18 may be supplied, and then the adsorption inhibitor AI may be supplied. In this case, a pulse of the purge gas 19 may be between a pulse of the metal precursor MP and a pulse of the reactant 18. In addition, the pulse of the metal precursor MP, the pulse of the reactant 18, and the pulse of the adsorption inhibitor AI may form one deposition cycle.

First, when the pulse of the metal precursor MP is supplied to the substrate 100, the metal precursor MP on the surface of the substrate 100 may be adsorbed onto the substrate 100 by chemical adsorption and physical adsorption. Thereafter, purging is performed with the purge gas 19 to remove the physically adsorbed metal precursor MP or an excess amount of the metal precursor MP, and thus, a monolayer of the metal precursor MP chemisorbed on the substrate 100 may be obtained.

Subsequently, when the reactant 18 is supplied into the reaction chamber, the reactant 18 may react with the metal precursor MP to form a metal nitride layer. Thereafter, when purging is performed with the purge gas 19, the excess amount of the reactant 18 or reaction byproducts may be removed.

Thereafter, when the pulse of the adsorption inhibitor AI is supplied to the substrate 100, the adsorption inhibitor AI supplied on the surface of the substrate 100 may be adsorbed onto the substrate 100 by chemical adsorption and physical adsorption. Thereafter, purging is performed with the purge gas 19 to remove the physically adsorbed adsorption inhibitor AI or an excess amount of the adsorption inhibitor AI, and thus, a monolayer of the adsorption inhibitor AI chemisorbed on the substrate 100 may be obtained.

In addition, the adsorption inhibitor AI may be adsorbed with a higher adsorption density at a position where a material is more preferred.

The above-described processes are set as one deposition cycle, and the deposition cycle may be repeated until the metal nitride layer is formed to a desirable thickness. In particular, the metal precursor MP of the next cycle may be adsorbed on the substrate 100 by avoiding a position where the adsorption inhibitor AI is adsorbed due to the adsorption inhibitor AI adsorbed in the previous cycle, and thus, a more uniform metal nitride layer may be formed as described in the example of FIG. 6A.

Figure 6C:
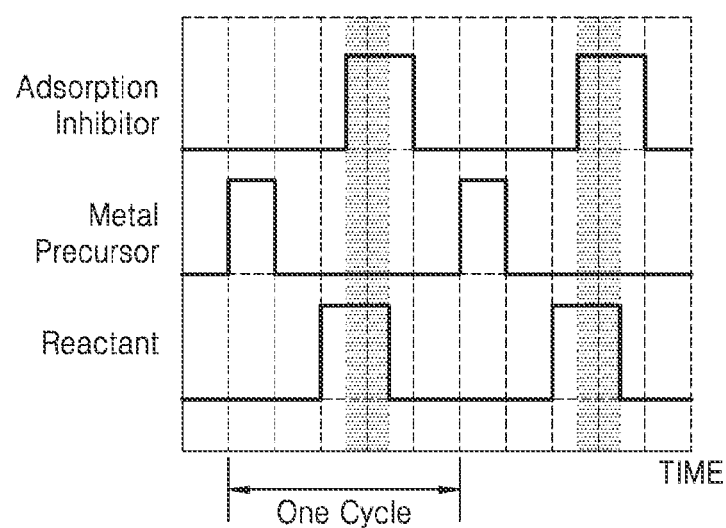

FIG. 6C is a diagram illustrating timing of supplying the adsorption inhibitor AI, the metal precursor MP, the purge gas 19, and the reactant 18 for forming a material layer, according to some embodiments of the inventive concept.

Referring to FIG. 6C, after the metal precursor MP is supplied on the substrate 100, the reactant 18 may be supplied, and the adsorption inhibitor AI may be supplied. In this case, a pulse of the purge gas 19 may be between a pulse of the metal precursor MP and a pulse of the reactant 18. In addition, the pulse of the metal precursor MP, the pulse of the reactant 18, and the pulse of the adsorption inhibitor AI may form one deposition cycle.

First, when the pulse of the metal precursor MP is supplied to the substrate 100, the metal precursor MP on the surface of the substrate 100 may be adsorbed onto the substrate 100 by chemical adsorption and physical adsorption. Thereafter, purging is performed with the purge gas 19 to remove the physically adsorbed metal precursor MP or the excess amount of metal precursor MP, and thus, a monolayer of the metal precursor MP chemisorbed on the substrate 100 may be obtained.

Subsequently, when the reactant 18 is supplied into the reaction chamber, the reactant 18 may react with the metal precursor MP to form a metal nitride layer. Thereafter, purging may optionally be performed with the purge gas 19, and the excess amount of reactant 18 or reaction byproducts may be removed.

When the pulse of the adsorption inhibitor AI is supplied to the substrate 100 while maintaining the supply of the reactant 18, the adsorption inhibitor AI may be adsorbed onto the substrate 100 by chemical adsorption and physical adsorption while the metal precursor MP is converted into a metal nitride.

Thereafter, purging is performed with the purge gas 19 to remove the physically adsorbed adsorption inhibitor AI or the excess amount of adsorption inhibitor AI, and thus, a monolayer of the adsorption inhibitor AI chemisorbed on the substrate 100 may be obtained.

The above-described processes are set as one deposition cycle, and the deposition cycle may be repeated until the metal nitride layer is formed to a desirable thickness. In particular, the metal precursor MP of the next cycle may be adsorbed on the substrate 100 by avoiding a position where the adsorption inhibitor AI is adsorbed due to the adsorption inhibitor AI adsorbed in the previous cycle, and thus, a more uniform metal nitride layer may be formed as described in the example of FIG. 6A.

In some embodiments, a period during which the adsorption inhibitor AI is provided may completely overlap a period during which the reactant 18 is provided.

Figure 6D:
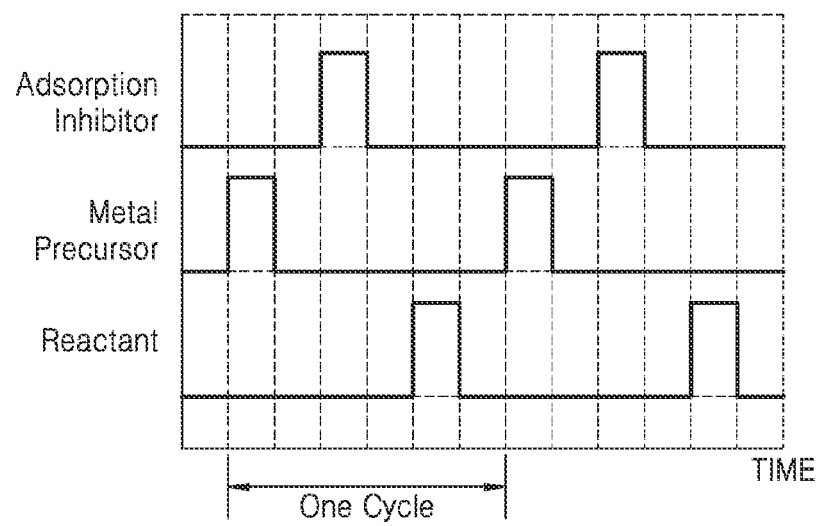

FIG. 6D is a diagram illustrating timing of supplying the adsorption inhibitor AI, the metal precursor MP, the purge gas 19, and the reactant 18 for forming a material layer, according to some embodiments of the inventive concept.

Referring to FIG. 6D, after the metal precursor MP is supplied on the substrate 100, the adsorption inhibitor AI may be supplied, and then the reactant 18 may be supplied. In this case, a pulse of the purge gas 19 may be between a pulse of the metal precursor MP, a pulse of adsorption inhibitor AI, and a pulse of the reactant 18. In addition, the pulse of the metal precursor MP, the pulse of the adsorption inhibitor AI, and the pulse of the reactant 18 may form one deposition cycle.

First, when the pulse of the metal precursor MP is supplied to the substrate 100, the metal precursor MP on the surface of the substrate 100 may be adsorbed onto the substrate 100 by chemical adsorption and physical adsorption. Thereafter, purging is performed with the purge gas 19 to remove the physically adsorbed metal precursor MP or the excess amount of metal precursor MP, and thus, a monolayer of the metal precursor MP chemisorbed on the substrate 100 may be obtained.

In addition, the metal precursor MP may be adsorbed with a higher adsorption density at a position where a material is more preferred.

Subsequently, when the pulse of the adsorption inhibitor AI is supplied on the substrate 100, the adsorption inhibitor AI may be adsorbed onto the substrate 100 by avoiding a position where the metal precursor MP is adsorbed. Thereafter, purging is performed with the purge gas 19 to remove the physically adsorbed adsorption inhibitor AI or the excess amount of adsorption inhibitor AI, and thus, a monolayer of the adsorption inhibitor AI chemisorbed on the substrate 100 may be obtained.

Thereafter, when the reactant 18 is supplied into the reaction chamber, the reactant 18 may react with the metal precursor MP to form a metal nitride layer. Thereafter, when purging is performed with the purge gas 19, the excess amount of reactant 18 or reaction byproducts may be removed.

The above-described processes are set as one deposition cycle, and the deposition cycle may be repeated until the metal nitride layer is formed to a desirable thickness. When the deposition cycle is repeated, the step of providing the metal precursor MP may be performed after the step of providing the reactant 18 and before the step of supplying the adsorption inhibitor AI.

The embodiments described with reference to FIGS. 6A to 6D are examples, and it is apparent that combinations thereof as well as supply cycles that a person skilled in the art may easily derive from the embodiments of FIGS. 6A to 6D are within the scope of the inventive concept.

FIGS. 7A to 7H are side cross-sectional views illustrating a method of manufacturing a semiconductor device, according to some embodiments of the inventive concept.

Figure 7A:
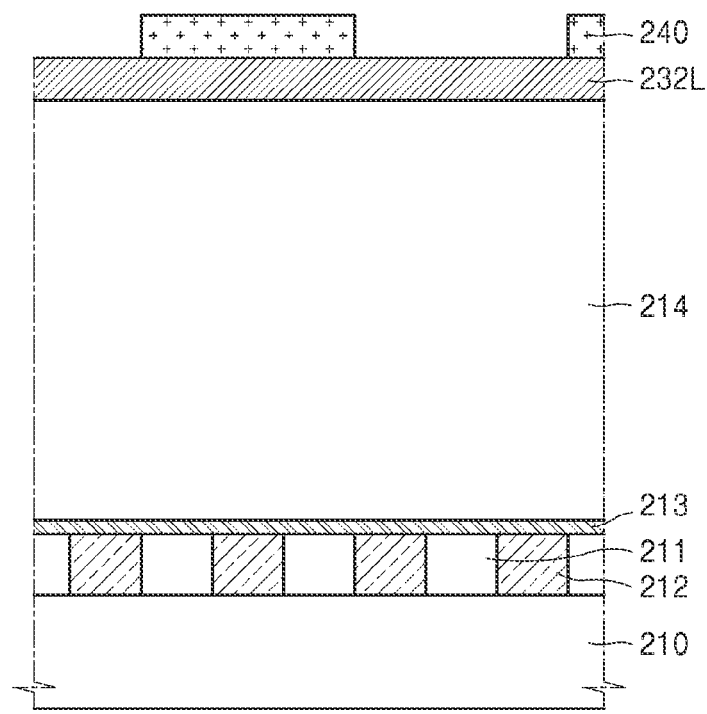
FIGS. 7A to 7H are side cross-sectional views illustrating methods of manufacturing a semiconductor device, according to some embodiments of the inventive concept.

Referring to FIG. 7A, an interlayer insulating layer 211, a contact plug 212, and an etch stop layer 213 may be formed over a substrate 210, and a first mold layer 214 for forming a capacitor may be formed thereon. A support layer 232L may be formed on the first mold layer 214. In some embodiments, the support layer 232L may have a thickness of about 10 nm to about 500 nm. A mask pattern 240 for patterning the support layer 232L may be formed on the support layer 232L. The mask pattern 240 may be formed to have a pattern corresponding to a support pattern to be formed later. The mask pattern 240 may include, for example, a photoresist pattern.

The substrate 210 may include a semiconductor substrate such as a silicon substrate, a germanium substrate, or a silicon-germanium substrate. However, the substrate 210 is not limited thereto and may also include any one of the substrates described above with reference to FIG. 2.

Although not illustrated in the drawings, a plurality of word lines and bit lines crossing each other may be formed on the substrate 210, and the lines (e.g., the plurality of word lines and bit lines) may be covered with the interlayer insulating layer 211. Doping regions may be arranged on both sides of each word line in the substrate 210, and each of the contact plugs 212 may be connected to one doping region. In addition, the contact plugs 212 may be electrically connected to corresponding switching elements. Each of the switching elements may include an active element such as a transistor or a diode.

The interlayer insulating layer 211 may include a dielectric material. For example, the interlayer insulating layer 211 may be formed of oxide, nitride, and/or oxynitride. The interlayer insulating layer 211 may also be formed as a single layer or may also be formed as two or more layers.

The contact plugs 212 passing through the interlayer insulating layer 211 may be formed on the active region of the substrate 210. The contact plugs 212 may be formed of at least one selected from a group consisting of a semiconductor material such as doped polysilicon; a metal such as tungsten (W), titanium (Ti), tantalum (Ta), copper (Cu), or aluminum (Al); a metal nitride such as tungsten nitride (WN), titanium nitride (TiN), or tantalum nitride (TaN); a metal silicon nitride such as titanium silicon nitride (TiSiN) or tungsten silicon nitride (WSiN); and metal silicide such as tungsten silicide (WSi).

The first mold layer 214 may be formed on the etch stop layer 213. The first mold layer 214 may include at least one of an oxide layer, a nitride layer, and an oxynitride layer.

Although not illustrated, a buffer layer (not illustrated) may be further formed between the first mold layer 214 and the etch stop layer 213. The buffer layer may include at least one of an oxide layer and a nitride layer.

The support layer 232L may be formed of a material with an etch selection rate for the first mold layer 214. For example, when a limulus amebocyte lysate (LAL) lift-off process is used to remove all or part of the first mold layer 214, the first mold layer 214 may be formed of a material with a low etch rate for LAL and a dielectric property.

When the first mold layer 214 is formed of one or more of $SiO_2$, SiGe, Si, and a carbon-based material, the support layer 232L may be formed of one selected from among SiN, SiCN, TaO, and $TiO_2$. However, the inventive concept is not limited to the materials.

Figure 7B:
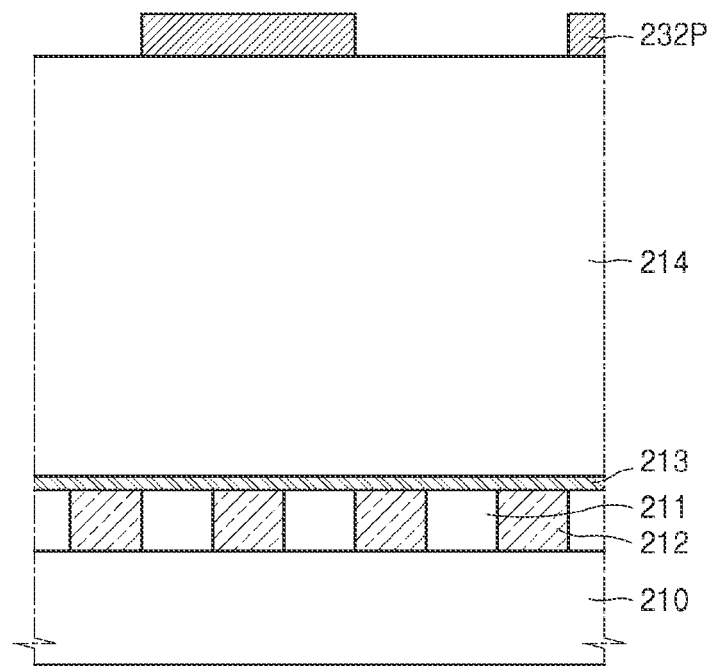

Referring to FIG. 7B, anisotropic etching may be performed for the exposed support layer 232L by using the mask pattern 240 as an etching mask to form a support layer pattern 232P. Part of the first mold layer 214 may be exposed in the support layer pattern 232P by the anisotropic etching.

Figure 7C:
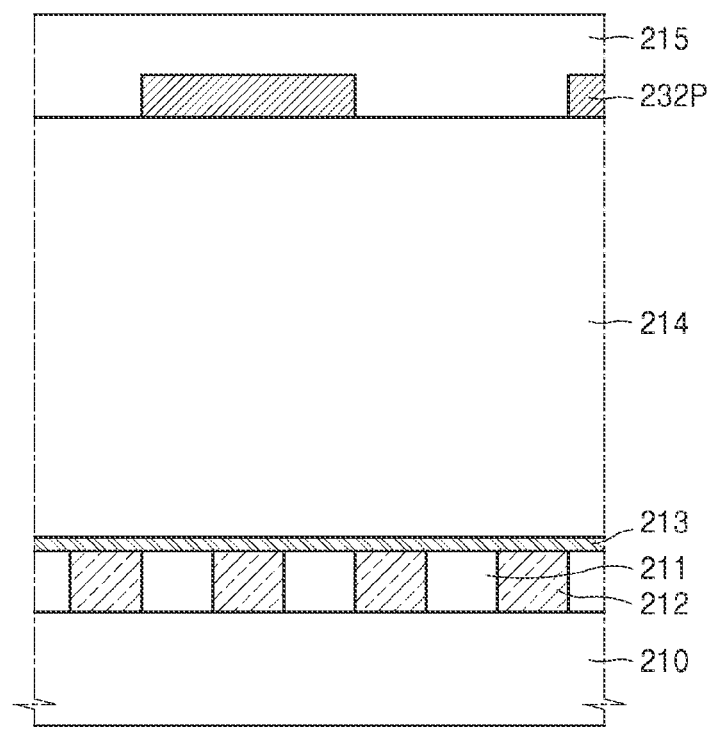

Referring to FIG. 7C, a second mold layer 215 may be formed on the first mold layer 214 and the support layer pattern 232P. The second mold layer 215 may be formed of the same material as the first mold layer 214 or may be formed to have an etch rate similar to an etch rate of the first mold layer 214 or may be formed of a material having a difference of 10% or less in the etch rate of the second mold layer 215 by the LAL compared to the etch rate of the first mold layer 214, for example, when the first mold layer 214 and the second mold layer 215 are removed through the LAL lift-off process. The second mold layer 215 may be formed to have a thickness sufficient to cover all of the support layer pattern 232P. For example, the second mold layer 215 may be formed to have a thickness of at least 50 nm. In addition, the sum of thicknesses of the first mold layer 214 and the second mold layer 215 may be about 2,000 Å to about 8,000 Å.

Figure 7D:
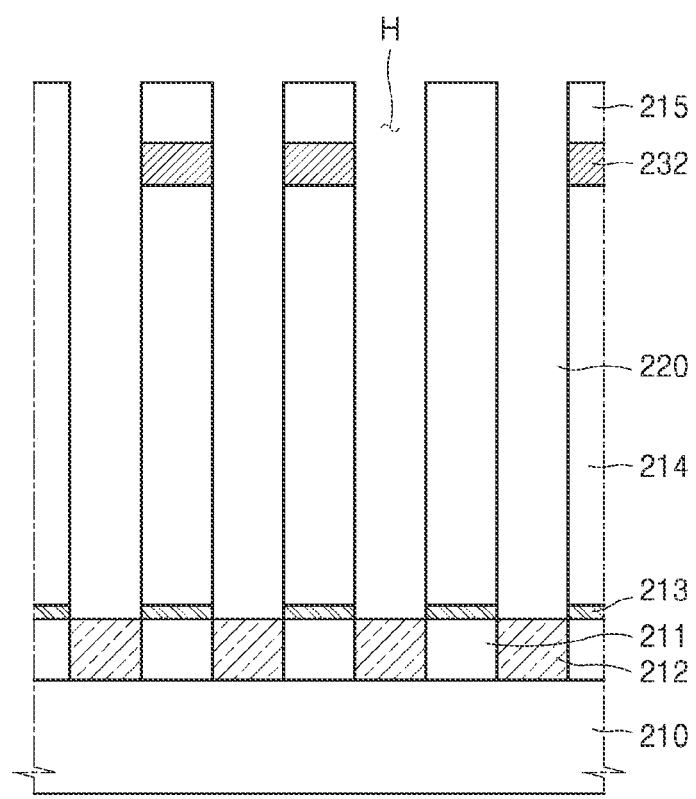

Referring to FIG. 7D, the second mold layer 215, the support layer pattern 232P, the first mold layer 214, and the etch stop layer 213 are etched until the contact plugs 212 are exposed at positions where lower electrodes are to be formed, and thus, a plurality of openings H are formed. The openings H may be connected to each other by the support layer pattern 232P. However, the openings H do not necessarily have to be connected to each other.

The openings H may expose upper surfaces of the contact plugs 212. The openings H may be formed by forming a mask pattern for defining the openings H on the second mold layer 215 and etching the first mold layer 214, the second mold layer 215, and the support layer pattern 232P by using the mask pattern as an etch mask. According to some embodiments, the openings H may each be formed in a hole shape.

The openings H may each have an extremely high aspect ratio of, for example, about 10 to about 200.

In addition, the openings H may be formed very densely, and for example, a gap between the openings H may be about 0.6 to about 1.5 times an inner diameter of the opening H.

Figure 7E:
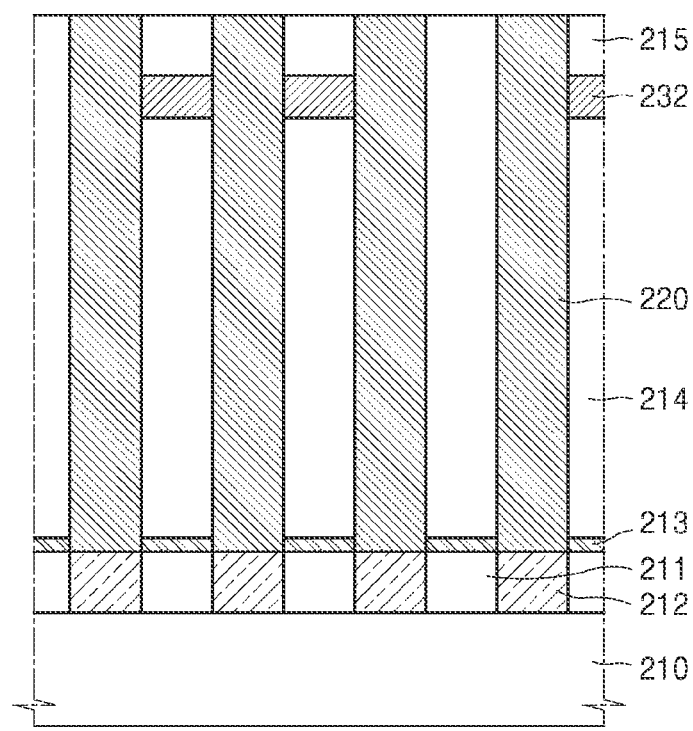

Referring to FIG. 7E, after depositing a conductive material on a front surface of the resultant substrate 210, that is, inside the openings H and on the second mold layer 215, the conductive materials in the respective openings H are separated to form a plurality of lower electrodes 220. The lower electrodes 220 may be formed by filling the insides of the openings H with conductive materials. The lower electrodes 220 may be electrically connected to the contact plugs 212.

As described above, the openings H may each have an extremely high aspect ratio, and thus, it is difficult to fill the insides of the openings H without a void. However, the conductive material layers may be formed uniformly (that is, very conformally) by using the method described with reference to FIGS. 1 to 3C, and thus, the insides of the openings H may be filled with the conductive materials without a void.

The lower electrodes 220 may each be formed of, for example, a semiconductor material such as doped polysilicon; a metal such as ruthenium (Ru), iridium (Ir), tungsten (W), molybdenum (Mo), titanium (Ti), vanadium (V), niobium (Nb), and/or tantalum (Ta); a conductive metal nitride layer such as titanium nitride (TiN), vanadium nitride (VN), niobium nitride (NbN), tantalum nitride (TaN), or tungsten nitride (WN); a conductive metal oxide such as iridium oxide (IrO); and/or a composite thereof. The lower electrodes 220 may each be formed as a single layer or may have a structure in which two or more layers are stacked.

Here, although the lower electrodes 220 of a pillar type are illustrated and described, the skilled will understand that the inventive concept may be equally applied to lower electrodes of a one-cylinder storage (OCS) type or a concave type.

Figure 8:
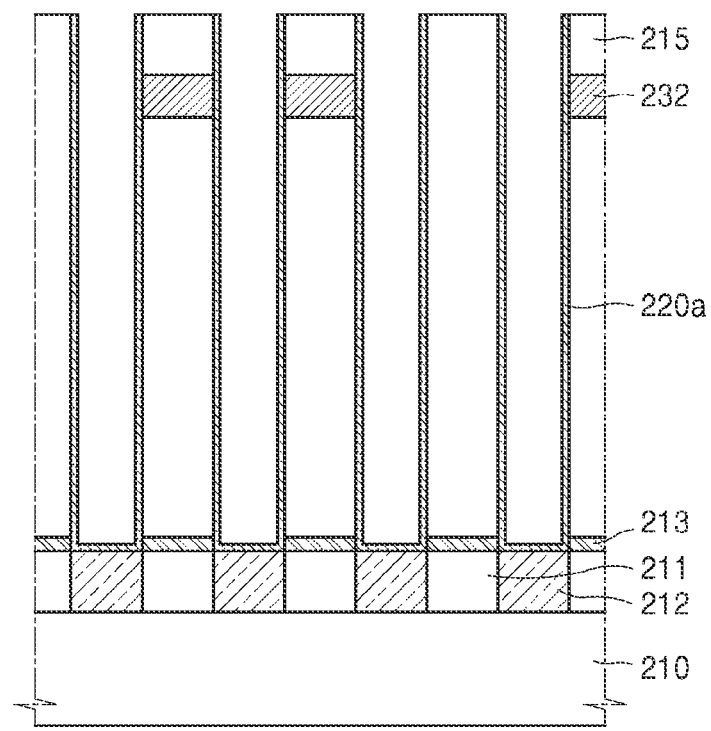
FIG. 8 is a side cross-sectional view of a lower electrode having a one-cylinder storage (OCS) shape with an open upper end.

FIG. 8 is a side cross-sectional view illustrating lower electrodes 220a that each have an OCS shape that is an open cylinder shape.

Referring to FIG. 8, after conformally depositing a conductive material to a predetermined thickness on inner walls of the openings H and the second mold layer 215 of FIG. 7D, the conductive materials on the inner walls of the respective openings H are separated to form a plurality of the lower electrodes 220a. By using the method described with reference to FIGS. 1 to 3C, the conductive material layers may be formed uniformly (that is, very conformally). For example, a ratio between a thickness of the thinnest part of the lower electrode 220a of an OCS shape and a thickness of the thickest part thereof may be about 0.80 to about 1.0. In some embodiments, the ratio may be about 0.80 to about 0.99, about 0.82 to about 0.98, about 0.84 to about 0.97, about 0.86 to about 0.96, about 0.88 to about 0.95, or about 0.90 to about 0.94 or may be in a certain range between the numerical values.

Figure 7F:
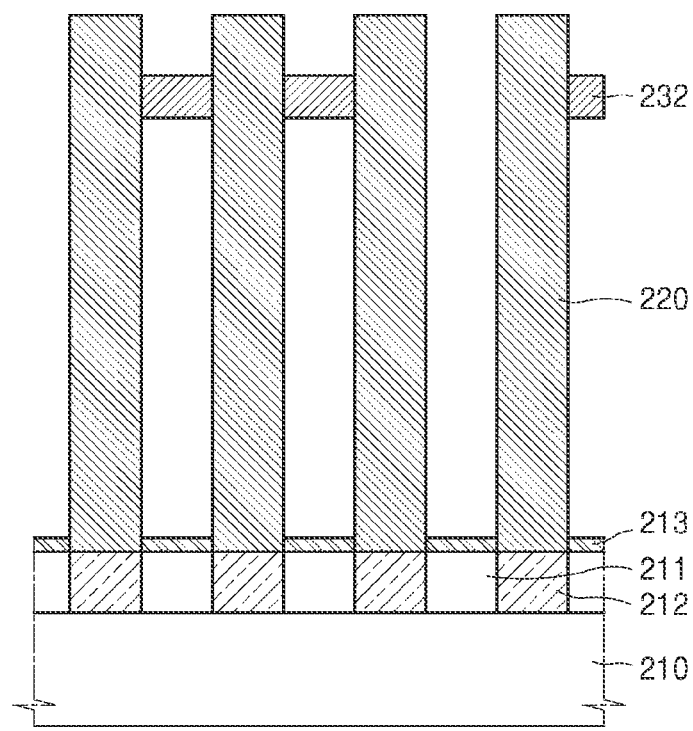

Referring to FIG. 7F, after the lower electrodes 220 are formed, the first mold layer 214 and the second mold layer 215 are removed. For example, the first mold layer 214 and the second mold layer 215 may be removed by using a lift-off process method using hydrofluoric acid, or LAL including ammonium fluoride ($NH_4F$), hydrofluoric acid (HF), and water. Accordingly, as described above, a material forming the support layer pattern 232P may be selected to have a lower etch rate than etch rates of the first and second mold layers 214 and 215 for the LAL. At least some of the lower electrodes 220 may be supported by a support pattern 232. In FIG. 7F, the support pattern 232 is formed at a height lower than an upper end of a pillar structure, that is, the pillar-shaped lower electrode 220. In some embodiments, the support pattern 232 may be formed at the same height as ends of the lower electrodes 220.

Figure 7G:
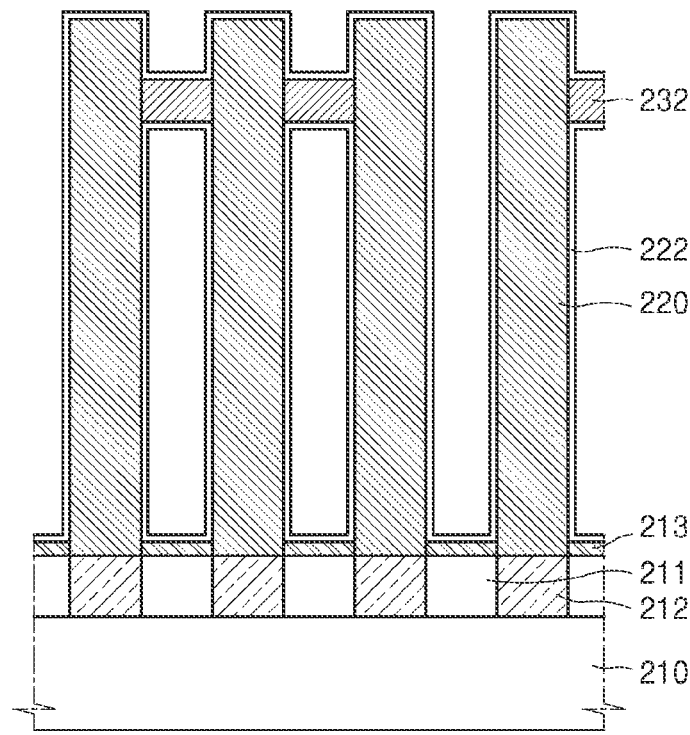

Referring to FIG. 7G, after the first mold layer 214 and the second mold layer 215 are removed, a capacitor dielectric layer 222 is conformally formed on the lower electrodes 220. The capacitor dielectric layer 222 may include, for example, a metal oxide and/or a metalloid oxide. Specifically, the capacitor dielectric layer 222 may be formed of, for example, silicon oxide, hafnium oxide, tantalum oxide, titanium oxide, zirconium oxide, aluminum oxide, $SrTiO_3$, $(Ba,Sr)TiO_3$, or so on but is not limited thereto.

Figure 7H:
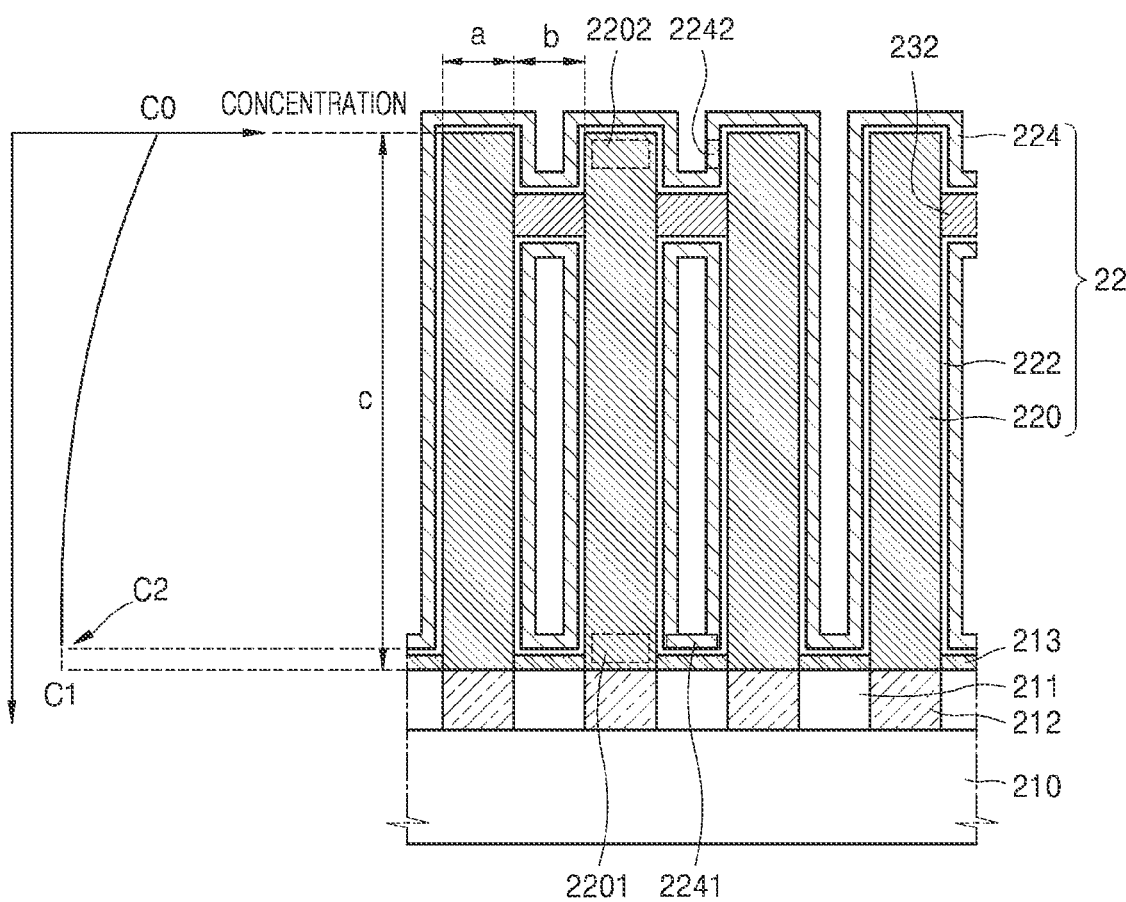

Referring to FIG. 7H, forming a capacitor 22 may be completed by forming an upper electrode 224 on the capacitor dielectric layer 222. The upper electrode 224 may each be formed of, for example, a semiconductor material such as doped polysilicon; a metal such as ruthenium (Ru), iridium (Ir), tungsten (W), molybdenum (Mo), titanium (Ti), vanadium (V), niobium (Nb), and/or tantalum (Ta); a conductive metal nitride layer such as titanium nitride (TiN), vanadium nitride (VN), niobium nitride (NbN), tantalum nitride (TaN), or tungsten nitride (WN); a conductive metal oxide such as iridium oxide (IrO); and/or a composite thereof. The upper electrode 224 may each be formed as a single layer or may have a structure in which two or more layers are stacked.

The material of the upper electrode 224 may also be the same as or different from the material of the lower electrode 220.

The upper electrode 224 may be conformally formed on a surface of the capacitor dielectric layer 222 to have a substantially constant thickness. In some embodiments, a ratio between a thickness of the thinnest part of the upper electrode 224 and a thickness of the thickest part thereof may be about 0.80 to about 1.0. In some embodiments, the ratio may be about 0.850 to about 0.999, about 0.900 to about 0.999, or about 0.950 to about 0.999 or may be in a range between the numerical values.

As described above, the openings H (refer to FIG. 7D) may be formed very densely. Therefore, it is difficult to fill a space between the lower electrodes 220 without a void. However, the conductive material layers forming the upper electrodes 224 may be formed uniformly (that is, very conformally) by using the method described with reference to FIGS. 1 to 3C, and thus, a space between the lower electrodes 220 may be filled with the conductive material without a void.

In addition, when the adsorption inhibitor AI is used to form the lower electrode 220 and/or the upper electrode 224, atoms of some elements contained in the adsorption inhibitor AI may remain in the lower electrodes 220 and/or the upper electrodes 224. The elements may be a Group 15 element and/or a Group 16 element, such as nitrogen (N), oxygen (O), phosphorus (P), or sulfur (S).

In some embodiments, content of nitrogen (N), oxygen (O), phosphorus (P), or sulfur (S) contained in the lower electrode 220 and/or the upper electrode 224 may be about 0.01 atomic percent (at %) to about 10 at %. In some embodiments, the content of nitrogen (N), oxygen (O), phosphorus (P), or sulfur (S) contained in the lower electrode 220 and/or the upper electrode 224 may be about 0.05 at % to about 9.5 at %, about 0.1 at % to about 9 at %, about 0.2 at % to about 8.5 at %, about 0.3 at % to about 8 at %, about 0.5 at % to about 7.5 at %, about 0.7 at % to about 7 at %, about 1.0 at % to about 6.8 at %, about 1.2 at % to about 6.6 at %, about 1.5 at % to about 6.3 at %, or about 2 at % to about 6 at %, or may be in a certain range between the numerical values.

In some embodiments, a concentration of the group 15 element or the group 16 element may increase as a distance from the semiconductor substrate 210 increases. In some embodiments, a concentration of nitrogen (N), oxygen (O), phosphorus (P), or sulfur (S) may increase as the distance from the semiconductor substrate 210 increases.

In some embodiments, the concentration of nitrogen (N), oxygen (O), phosphorus (P), or sulfur (S) in an uppermost end 2202 of the lower electrode 220 may be about 101% to about 140% of the concentration of nitrogen (N), oxygen (O), phosphorus (P), or sulfur (S) in a lowermost end 2201 of the lower electrode 220.

In some embodiments, the concentration of the group 15 element or the group 16 element in a portion 2242 of the upper electrode 224 at the same level as the uppermost end 2202 of the lower electrode 220 may be about 101% to about 140% of the concentration of the group 15 element or the group 16 element in the lowermost end 2241 of the upper electrode 224. In some embodiments, at the same level as the uppermost end 2202 of the lower electrode 220, the concentration of nitrogen (N), oxygen (O), phosphorus (P), or sulfur (S) in the portion 2242 of the upper electrode 224 may be about 101% to about 140% of the concentration of nitrogen (N), oxygen (O), phosphorus (P), or sulfur (S) in the lowermost end 2241 of the upper electrode 224.

A characteristic ratio (CR) may be defined as in Equation 1 below by using each dimension of the lower electrode 220.

$$CR = c/\min(a,b) \quad \text{Equation 1}$$

wherein a is a horizontal width of the lower electrode, b is a shortest separation distance between the lower electrodes, c is a vertical height of an outer surface of the lower electrode, and min(a,b) is a relatively smaller number between a and b.

In some embodiments, a CR of the lower electrode 220 may be 30 or more, or 45 or more. For example, the CR may be about 30 to about 200, about 40 to about 150, about 45 to about 120, about 50 to about 100, or about 55 to about 80.

Figure 9A:
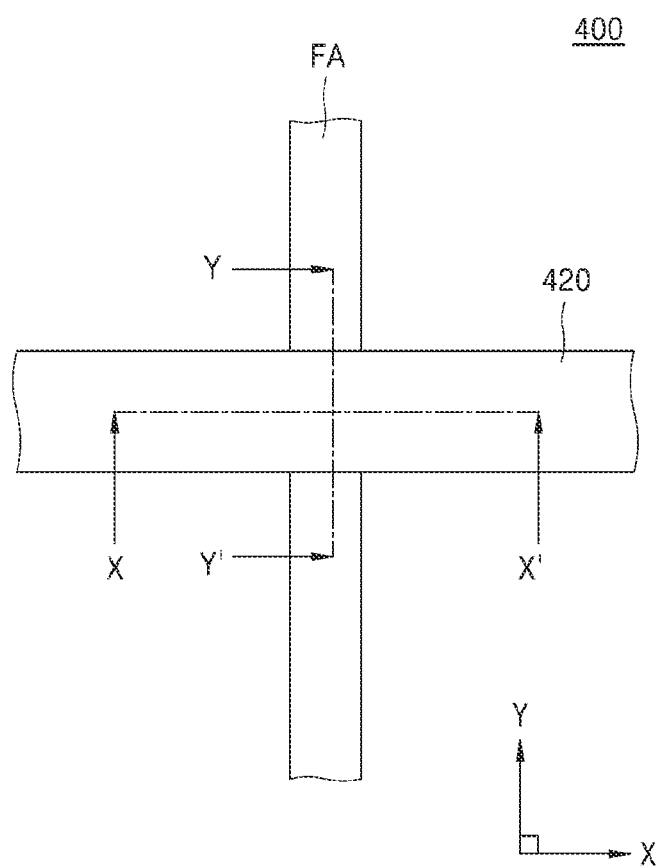
FIGS. 9A to 9C are views illustrating methods of manufacturing a semiconductor device, according to some embodiments of the inventive concept.
Figure 9B:
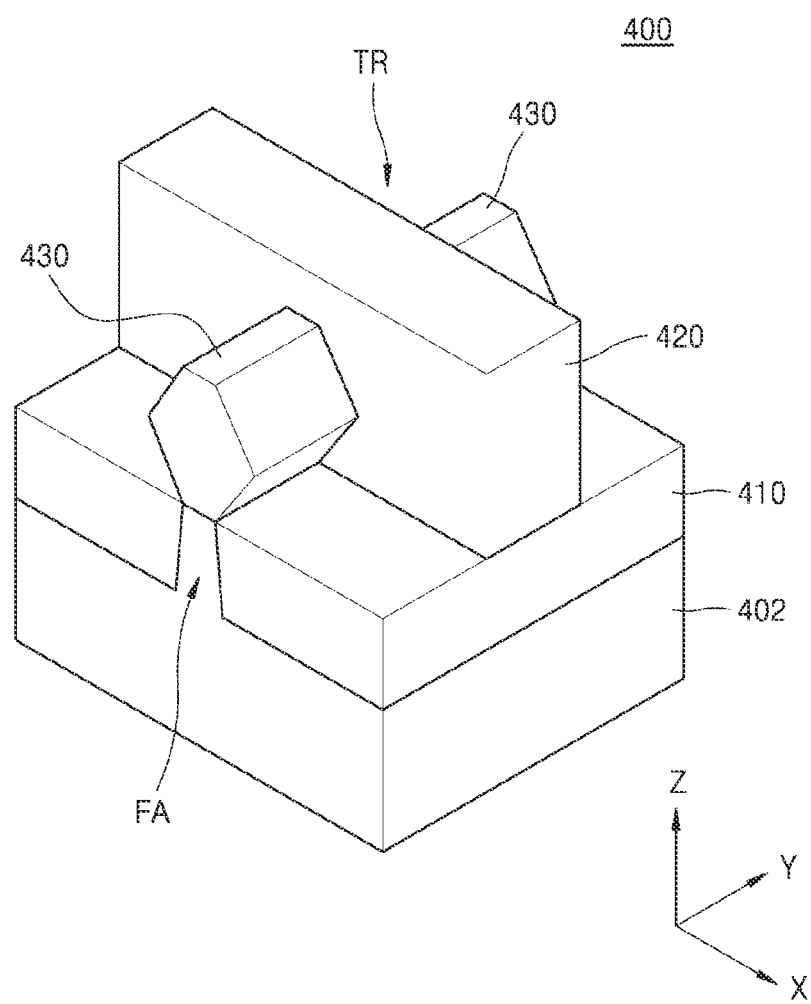
Figure 9C:
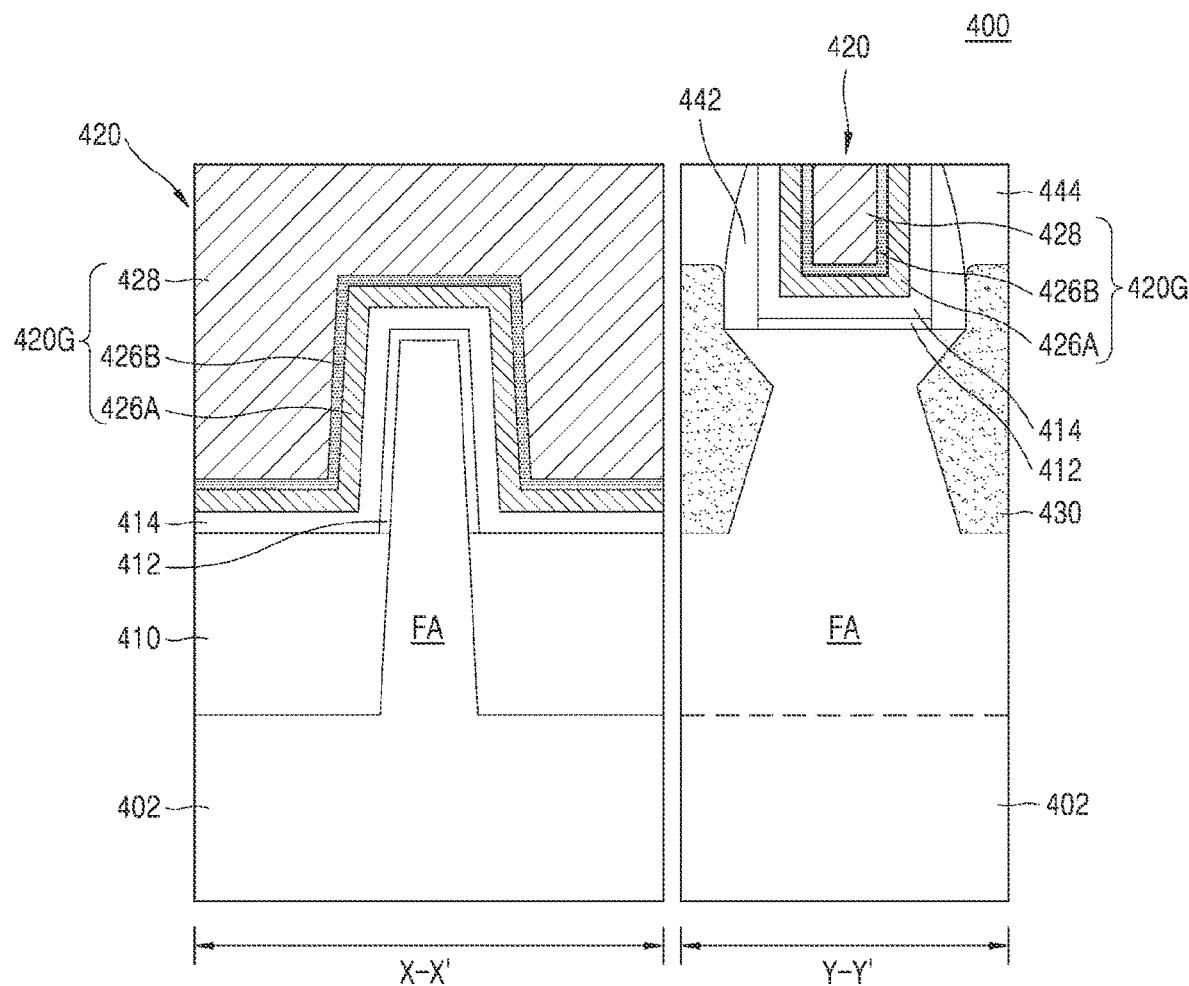

FIGS. 9A to 9C are views illustrating a method of manufacturing a semiconductor device 400 according to some embodiments of the inventive concept, FIG. 9A is a plan view of the semiconductor device 400 to be manufactured, FIG. 9B is a perspective view of the semiconductor device 400 of FIG. 9A, and FIG. 9C illustrates cross sections taken along line X-X' and line Y-Y' of FIG. 9A.

Referring to FIGS. 9A to 9C, the semiconductor device 400 includes a fin-type active region FA protruding from a substrate 402.

Details of the substrate 402 are substantially the same as the details described for the substrate 210 with reference to FIG. 7A.

The substrate 402 may be formed of a group III-V material or a group IV material, thereby being used as a channel material for forming a low-power and high-speed transistor. When forming an NMOS transistor in the substrate 402, the substrate 402 may be formed of any one of group III-V materials. For example, the substrate 402 may be formed of GaAs. When a PMOS transistor is formed in the substrate 402, the substrate 402 may be formed of a semiconductor material, for example, Ge with a higher hole mobility than an Si substrate.

The fin-type active region FA may extend in one direction (the Y direction in FIGS. 9A and 9B). An element isolation layer 410 covering a lower sidewall of the fin-type active region FA may be formed on the substrate 402. The fin-type active region FA protrudes above the element isolation layer 410 in a fin type. In some embodiments, the element isolation layer 410 may be configured with a silicon oxide layer, a silicon nitride layer, a silicon oxynitride layer, or a combination thereof but is not limited thereto.

A gate structure 420 may extend in a direction (X direction) crossing an extension direction of the fin-type active region FA on the fin-type active region FA over the substrate 410. A pair of source/drain regions 430 may be formed on both sides of the gate structure 420 in the fin-type active region FA.

The pair of source/drain regions 430 may include a semiconductor layer epitaxially grown from the fin-type active region FA. Each of the pair of source/drain regions 430 may be configured with an embedded SiGe structure including a plurality of epitaxially grown SiGe layers, an epitaxially grown Si layer, or an epitaxially grown SiC layer. Although FIG. 9B illustrates a case where the pair of source/drain regions 430 has a specified shape, according to the inventive concept, the cross-sectional shape of the pair of source/drain regions 430 is not limited to the shape illustrated in FIG. 9B and may include various shapes. For example, the pair of source/drain regions 430 may have various cross-sectional shapes such as a circle, an ellipse, and a polygon.

A MOS transistor TR may be formed at a portion where the fin-type active region FA intersects the gate structure 420. The MOS transistor TR includes a MOS transistor having a three-dimensional structure including channels formed on an upper surface and both sides of the fin-type active region FA. The MOS transistor TR may be an NMOS transistor or a PMOS transistor.

As illustrated in FIG. 9C, the gate structure 420 may include an interface layer 412, a high-k layer 414, a first metal-containing layer 426A, a second metal-containing layer 426B, and a gap-fill metal layer 428 which are sequentially formed from a surface of the fin-type active region FA. The first metal-containing layer 426A, the second metal-containing layer 426B, and the gap-fill metal layer 428 of the gate structure 420 may constitute a gate electrode 420G.

Insulating spacers 442 may be formed on both sides of the gate structure 420. An interlayer insulating layer 444 covering the insulating spacers 442 may be formed on an opposite side of the gate structure 420 about the insulating spacer 442.

The interface layer 412 may be formed on a surface of the fin-type active region FA. The interface layer 412 may be formed of an insulating material, for example, an oxide layer, a nitride layer, and/or an oxynitride layer. The interface layer 412 may constitute a gate insulating layer together with the high-k layer 414.

The high-k layer 414 may be formed of a material with a higher dielectric constant than a dielectric constant of a silicon oxide layer. In some embodiments, the high-k layer 414 may include two or more selected from a group consisting of silicon (Si), strontium (Sr), barium (Ba), titanium (Ti), lead (Pb), zirconium (Zr), and hafnium (Hf). For example, the high-k layer 414 may have a dielectric constant of about 4 to 100. The high-k layer 414 may be formed of a material selected from zirconium oxide, zirconium silicon oxide, hafnium oxide, hafnium oxynitride, hafnium silicon oxide, tantalum oxide), titanium oxide, barium strontium titanium oxide, barium titanium oxide, strontium titanium oxide, yttrium oxide, aluminum oxide, lead scandium tantalum oxide, lead zinc niobate, and combinations thereof, but a material forming the high-k layer 414 is not limited to the material descried above.

The high-k layer 414 may be formed through an atomic layer deposition (ALD) process. In order to form the high-k layer 414, a nitride layer forming method according to the inventive concept described with reference to FIGS. 1 to 3C may be used.

In some embodiments, the first metal-containing layer 426A may include a nitride of Ti, a nitride of Ta, an oxynitride of Ti, or an oxynitride of Ta. For example, the first metal-containing layer 426A may be formed of TiN, TaN, TiAlN, TaAlN, TiSiN, or a combination thereof. The first metal-containing layer 426A may be formed through various deposition methods, such as ALD, chemical vapor deposition (CVD), or physical vapor deposition (PVD). In some embodiments, the first metal-containing layer 426A may be formed by using a nitride layer forming method according to the inventive concept described with reference to FIGS. 1 to 3C.

In some embodiments, the second metal-containing layer 426B may be formed of an N-type metal-containing layer which is required for an NMOS transistor and includes an Al compound containing Ti or Ta. For example, the second metal-containing layer 426B may be formed of TiAlC, TiAlN, TiAlCN, TiAl, TaAlC, TaAlN, TaAlCN, TaAl, or a combination thereof.

In some other embodiments, the second metal-containing layer 426B may be formed of a P-type metal-containing layer required for a PMOS transistor. For example, the second metal-containing layer 426B may include at least one of Mo, Pd, Ru, Pt, TiN, WN, TaN, Ir, TaC, RuN, and MoN.

The second metal-containing layer 426B may be formed as a single layer or multiple layers.

In some embodiments, when the second metal-containing layer 426B is a metal nitride, the nitride layer forming method according to the inventive concept described with reference to FIGS. 1 to 3C may be used.

The second metal-containing layer 426B may serve to adjust a work function of the gate structure 420 together with the first metal-containing layer 426A. A threshold voltage of the gate structure 420 may be adjusted by adjusting work functions of the first metal-containing layer 426A and the second metal-containing layer 426B. In some embodiments, one of the first metal-containing layer 426A and the second metal-containing layer 426B may be omitted.

The gap-fill metal layer 428 may be formed to fill a remaining gate space on the second metal-containing layer 426B when the gate structure 420 is formed through a replacement metal gate (RMG) process. When there is no gate space remaining on the second metal-containing layer 426B after forming the second metal-containing layer 426B, the gap-fill metal layer 428 may also be omitted without being formed on the second metal-containing layer 426B.

The gap-fill metal layer 428 may include a material selected from a group consisting of W, TiN, and TaN, Al, metal carbide, metal silicide, metal aluminum carbide, metal aluminum nitride, a metal silicon nitride, and so on.

A method of manufacturing the semiconductor device 400 according to the embodiments of the inventive concept described with reference to FIGS. 9A to 9C may use a process of forming a material layer in the nitride layer forming method according to the inventive concept to form the high-k layer 414, the first metal-containing layer 426A, and the second metal-containing layer 426B.

Although a method of manufacturing a semiconductor device including a Fin field effect transistor (FET) including a channel having a three-dimensional structure is described with reference to FIGS. 9A to 9C, the inventive concept is not limited thereto. It will be apparent to those skilled in the art that, for example, methods of forming semiconductor devices including a planar metal oxide semiconductor (MOS) FET with characteristics according to the inventive concept may be provided through various modifications and changes of the inventive concept within the scope of the inventive concept described above.

Hereinafter, configurations and effects of the inventive concept will be described in more detail with reference to specified embodiments and comparative examples, and the embodiments are merely for understanding the inventive concept more clearly and are not intended to limit the scope of the inventive concept.

Experiment 1

An opening was formed in an $SiO_2$ insulating layer on a silicon substrate, and a TiN layer was formed as a lower electrode in the opening at 550° C. When an adsorption inhibitor was not used, a step coverage was measured to be 90%, and when the adsorption inhibitor was used and other deposition conditions were the same as each other, the step coverage was measured to be 94%. Therefore, it was found that, when the adsorption inhibitor was used, the step coverage was improved by about four percentage points.

In addition, an average grain size was also measured at this time, and results are illustrated in FIG. 10A.

As illustrated in FIG. 10A, it is found that, when the adsorption inhibitor was used, a grain size and crystallinity increased.

Experiment 2

An $SiO_2$ insulating layer was removed, an $HfO_2$ layer was formed as a dielectric layer on the entire surface of a lower electrode, and a TiN layer was formed thereon as an upper electrode at 430° C. When an adsorption inhibitor was not used, a step coverage was measured to be 74%, and when the adsorption inhibitor was used and other deposition conditions were the same as each other, the step coverage was measured to be 82%. Therefore, it is found that, when the adsorption inhibitor was used, the step coverage was improved by about 8 percentage points.

Specific resistances were measured for the formed lower electrode and upper electrode, respectively, and results are summarized in FIG. 10B.

As illustrated in FIG. 10B, it is found that, when the adsorption inhibitor was used, the specific resistances were further reduced compared to when the adsorption inhibitor was not used.

While the inventive concept has been particularly shown and described with reference to embodiments thereof, it will be understood that various changes in form and details may be made therein without departing from the spirit and scope of the following claims.

What is claimed is:

1. A method of forming a material layer, the method comprising:
a deposition cycle comprising:
providing an adsorption inhibitor on a substrate;
purging an excess amount of the adsorption inhibitor;
providing a metal precursor on the substrate;
purging an excess amount of the metal precursor; and
supplying a reactant to form a material layer on the substrate,
wherein the adsorption inhibitor includes a group 15 element or a group 16 element, and
wherein the reactant includes one or more selected from a group consisting of nitrogen ($N_2$), ammonia ($NH_3$), hydrazine ($N_2H_4$), diazene ($N_2H_2$), $N_2O$, NO, $NO_2$, $N_2$ plasma, $NH_3$ plasma, $H_2$ plasma, and $NF_3$.

2. The method of claim 1, wherein the adsorption inhibitor has a structure of R—$A_n$-R', wherein A is oxygen (O), sulfur (S), selenium (Se), tellurium (Te), or polonium (Po), n is an integer of 1, 2, or 3, R and R' are each independently hydrogen, an alkyl group having 1 to 10 carbons, an alkenyl group having 2 to 10 carbons, an alkynyl group having 2 to 10 carbons, an aryl group having 6 to 15 carbons, a cycloalkyl group having 3 to 12 carbons, or a cycloalkenyl group having 3 to 12 carbons, provided that at least one of R and R' is not hydrogen, and optionally R and R' together form a ring.

3. The method of claim 2, wherein the adsorption inhibitor is at least one selected from a group consisting of $CH_3OH$, $C_2H_5OH$, $C_3H_7OH$, $C_4H_9OH$, $CH_3$—O—$CH_3$, $C_2H_5$—O—$CH_3$, $C_3H_7$—O—$CH_3$, $C_4H_9$—O—$CH_3$, $C_2H_5$—O—$C_2H_5$, $C_3H_7$—O—$C_2H_5$, $C_4H_9$—O—$C_2H_5$, $C_3H_7$—O—$C_3H_7$, $C_4H_9$—O—$C_3H_7$, and $C_4H_9$—O—$C_4H_9$.

4. The method of claim 1, wherein the adsorption inhibitor has a structure of $D_m$(RR'R''), wherein D is nitrogen (N), phosphorus (P), arsenic (As), antimony (Sb), or bismuth (Bi), m is 1 or 2, R, R', and R'' are each independently hydrogen, an alkyl group having 1 to 10 carbons, an alkenyl group having 2 to 10 carbons, an alkynyl group having 2 to 10 carbons, an aryl group having 6 to 15 carbons, a cycloalkyl group having 3 to 12 carbons, or a cycloalkenyl group having 3 to 12 carbons, provided that at least one of R, R', and R'' is not hydrogen, and optionally two or more of R, R', and R'' together form a ring.

5. The method of claim 1, wherein the adsorption inhibitor has a structure of $X_1$-QO—$X_2$, $X_1$-$QO_2$—$X_2$, or (QO)$X_1X_2X_3$, wherein Q is oxygen (O), sulfur (S), selenium (Se), tellurium (Te), polonium (Po), nitrogen (N), phosphorus (P), arsenic (As), antimony (Sb), or bismuth (Bi), $X_1$, $X_2$, and $X_3$ are each independently hydrogen, an alkyl group having 1 to 10 carbons, an alkenyl group having 2 to 10 carbons, an alkynyl group having 2 to 10 carbons, an aryl group having 6 to 15 carbons, a cycloalkyl group having 3 to 12 carbons, a cycloalkenyl group having 3 to 12 carbons, —$OR_1$, —$NR_1R_1'$, or —$SR_1$, provided that at least one of $X_1$, $X_2$, and $X_3$ is not hydrogen, and optionally at least two of $X_1$, $X_2$, and $X_3$ together form a ring, and
$R_1$ and $R_1'$ are each independently hydrogen, an alkyl group having 1 to 5 carbons, an alkenyl group having 2 to 5 carbons, an alkynyl group having 2 to 5 carbons, an aryl group having 6 to 10 carbons, a cycloalkyl group having 3 to 7 carbons, or a cycloalkenyl group having 3 to 7 carbons.

6. The method of claim 1, wherein the adsorption inhibitor has a structure of R—CN, wherein R is hydrogen, an alkyl group having 1 to 10 carbons, an alkenyl group having 2 to 10 carbons, an alkynyl group having 2 to 10 carbons, an aryl group having 6 to 15 carbons, a cycloalkyl group having 3 to 12 carbons, or a cycloalkenyl group having 3 to 12 carbons.

7. The method of claim 1, wherein the adsorption inhibitor includes a heteroaromatic ring including at least one selected from a group consisting of nitrogen (N), oxygen (O), and sulfur (S) as a heterogeneous element.

8. The method of claim 7, wherein the adsorption inhibitor is at least one selected from a group consisting of pyridine, pyrimidine, pyrazine, pyrrole, imidazole, oxazole, thiophene, and derivatives thereof.

9. The method of claim 1, wherein the adsorption inhibitor has a structure of $X_1$—C(=O)—$X_2$ or $X_1$—C(=S)—$X_2$, wherein $X_1$ and $X_2$ are each independently hydrogen, an alkyl group having 1 to 10 carbons, an alkenyl group having 2 to 10 carbons, an alkynyl group having 2 to 10 carbons, an aryl group having 6 to 15 carbons, a cycloalkyl group having 3 to 12 carbons, a cycloalkenyl group having 3 to 12 carbons, —$OR_1$, —$NR_1R_1'$, or —$SR_1$, provided that at least one of $X_1$ and $X_2$ is not hydrogen, and optionally $X_1$ and $X_2$ together form a ring, and
$R_1$ and $R_1'$ are each independently hydrogen, an alkyl group having 1 to 5 carbons, an alkenyl group having 2 to 5 carbons, an alkynyl group having 2 to 5 carbons, an aryl group having 6 to 10 carbons, a cycloalkyl group having 3 to 7 carbons, or a cycloalkenyl group having 3 to 7 carbons.

10. The method of claim 1, wherein the deposition cycle is repeated, and
the providing of the metal precursor is performed after providing the adsorption inhibitor and before supplying the reactant when the deposition cycle is repeated.

11. The method of claim 10, wherein the providing of the adsorption inhibitor is performed immediately after supplying the reactant.

12. The method of claim 1, wherein the providing of the adsorption inhibitor at least partially overlaps with the supplying of the reactant.

13. The method of claim 1, wherein the deposition cycle is repeated, and
the providing of the metal precursor is performed after supplying the reactant and before providing the adsorption inhibitor when the deposition cycle is repeated.

14. A method of manufacturing a semiconductor device comprising:
forming a lower electrode electrically connected to an active region of a semiconductor substrate;
forming a dielectric layer on a surface of the lower electrode; and
forming an upper electrode on the dielectric layer,
wherein at least one of forming the lower electrode and forming the upper electrode includes the method according to claim 1, and the deposition cycle is repeated.

15. The method of claim 14, wherein the adsorption inhibitor has a structure of R—$A_n$-R', wherein A is oxygen (O), sulfur (S), selenium (Se), tellurium (Te), or polonium (Po), n is an integer of 1, 2, or 3, R and R' are each independently hydrogen, an alkyl group having 1 to 10 carbons, an alkenyl group having 2 to 10 carbons, an alkynyl group having 2 to 10 carbons, an aryl group having 6 to 15 carbons, a cycloalkyl group having 3 to 12 carbons, or a cycloalkenyl group having 3 to 12 carbons, provided that at least one of R and R' is not hydrogen, and optionally R and R' together form a ring.

16. The method of claim 14, wherein the adsorption inhibitor has a structure of $D_m(RR'R'')$, wherein D is nitrogen (N), phosphorus (P), arsenic (As), antimony (Sb), or bismuth (Bi), m is 1 or 2, R, R', and R" are each independently hydrogen, an alkyl group having 1 to 10 carbons, an alkenyl group having 2 to 10 carbons, an alkynyl group having 2 to 10 carbons, an aryl group having 6 to 15 carbons, a cycloalkyl group having 3 to 12 carbons, or a cycloalkenyl group having 3 to 12 carbons, provided that at least one of R, R', and R" is not hydrogen, and optionally two or more of R, R', and R" together form a ring.

17. The method of claim 14, wherein, when the deposition cycle is repeated, the providing of the metal precursor is performed after providing the adsorption inhibitor and before supplying the reactant.

18. The method of claim 14, wherein, when the deposition cycle is repeated, the providing of the metal precursor is performed after supplying the reactant and before providing the adsorption inhibitor.

19. A method of forming a material layer, the method including a deposition cycle comprising:
providing an adsorption inhibitor on a substrate in a reaction chamber;
purging an excess amount of the adsorption inhibitor from the reaction chamber;
providing a metal precursor on the substrate;
purging an excess amount of the metal precursor from the reaction chamber; and
supplying a reactant to form the material layer on the substrate,
wherein the adsorption inhibitor includes nitrogen (N), oxygen (O), phosphorus (P), or sulfur (S), and
the adsorption inhibitor and the metal precursor are supplied into the reaction chamber through a vaporizer, and
wherein the reactant includes one or more selected from a group consisting of nitrogen ($N_2$), ammonia ($NH_3$), hydrazine ($N_2H_4$), diazene ($N_2H_2$), $N_2O$, NO, $NO_2$, $N_2$ plasma, $NH_3$ plasma, $H_2$ plasma, and $NF_3$.

20. A method of forming a material layer, the method comprising:
a deposition cycle comprising:
providing an adsorption inhibitor on a substrate;
purging an excess amount of the adsorption inhibitor;
providing a metal precursor on the substrate;
purging an excess amount of the metal precursor; and
supplying a reactant to form a material layer on the substrate,
wherein the adsorption inhibitor includes a group 15 element or a group 16 element, and
wherein:
the adsorption inhibitor has a structure of $X_1$—C(=O)—$X_2$ or $X_1$—C(=S)—$X_2$, wherein $X_1$ and $X_2$ are each independently hydrogen, an alkyl group having 1 to 10 carbons, an alkenyl group having 2 to 10 carbons, an alkynyl group having 2 to 10 carbons, an aryl group having 6 to 15 carbons, a cycloalkyl group having 3 to 12 carbons, a cycloalkenyl group having 3 to 12 carbons, —$OR_1$, —$NR_1R_1'$, or —$SR_1$, provided that at least one of $X_1$ and $X_2$ is not hydrogen, and optionally $X_1$ and $X_2$ together form a ring, and $R_1$ and $R_1'$ are each independently hydrogen, an alkyl group having 1 to 5 carbons, an alkenyl group having 2 to 5 carbons, an alkynyl group having 2 to 5 carbons, an aryl group having 6 to 10 carbons, a cycloalkyl group having 3 to 7 carbons, or a cycloalkenyl group having 3 to 7 carbons; or
the adsorption inhibitor has a structure of $X_1$-QO—$X_2$, $X_1$-$QO_2$—$X_2$, or $(QO)X_1X_2X_3$, wherein Q is oxygen (O), sulfur (S), selenium (Se), tellurium (Te), polonium (Po), nitrogen (N), phosphorus (P), arsenic (As), antimony (Sb), or bismuth (Bi), $X_1$, $X_2$, and $X_3$ are each independently hydrogen, an alkyl group having 1 to 10 carbons, an alkenyl group having 2 to 10 carbons, an alkynyl group having 2 to 10 carbons, an aryl group having 6 to 15 carbons, a cycloalkyl group having 3 to 12 carbons, a cycloalkenyl group having 3 to 12 carbons, —$OR_1$, —$NR_1R_1'$, or —$SR_1$, provided that at least one of $X_1$, $X_2$, and $X_3$ is not hydrogen, and optionally at least two of $X_1$, $X_2$, and $X_3$ together form a ring, and $R_1$ and $R_1'$ are each independently hydrogen, an alkyl group having 1 to 5 carbons, an alkenyl group having 2 to 5 carbons, an alkynyl group having 2 to 5 carbons, an aryl group having 6 to 10 carbons, a cycloalkyl group having 3 to 7 carbons, or a cycloalkenyl group having 3 to 7 carbons; or
the adsorption inhibitor has a structure of $D_m(RR'R'')$, wherein D is nitrogen (N), phosphorus (P), arsenic (As), antimony (Sb), or bismuth (Bi), m is 1 or 2, R, R', and R" are each independently hydrogen, an alkyl group having 1 to 10 carbons, an alkenyl group having 2 to 10 carbons, an alkynyl group having 2 to 10 carbons, an aryl group having 6 to 15 carbons, a cycloalkyl group having 3 to 12 carbons, or a cycloalkenyl group having 3 to 12 carbons, provided that at least one of R, R', and R" is not hydrogen, and optionally two or more of R, R', and R" together form a ring.

* * * * *